US011417683B2

(12) United States Patent
Lue

(10) Patent No.: US 11,417,683 B2
(45) Date of Patent: Aug. 16, 2022

(54) FLASH MEMORY AND METHOD OF FABRICATING THE SAME

(71) Applicant: MACRONIX International Co., Ltd., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 162 days.

(21) Appl. No.: 17/077,847

(22) Filed: Oct. 22, 2020

(65) Prior Publication Data

US 2022/0130862 A1 Apr. 28, 2022

(51) Int. Cl.
| *H01L 27/11597* | (2017.01) |
| *H01L 27/11556* | (2017.01) |
| *H01L 27/11519* | (2017.01) |
| *H01L 27/11587* | (2017.01) |

(52) U.S. Cl.
CPC .. *H01L 27/11597* (2013.01); *H01L 27/11519* (2013.01); *H01L 27/11556* (2013.01); *H01L 27/11587* (2013.01)

(58) Field of Classification Search
CPC ......... H01L 27/11597; H01L 27/11519; H01L 27/11556; H01L 27/11587
See application file for complete search history.

(56) References Cited

U.S. PATENT DOCUMENTS

| 11,031,414 | B2 * | 6/2021 | Hopkins | ........... H01L 27/11582 |
| 2014/0225181 | A1 | 8/2014 | Makala et al. | |
| 2015/0037950 | A1 | 2/2015 | Alsmeier et al. | |
| 2017/0365614 | A1 | 12/2017 | Tang et al. | |
| 2018/0102375 | A1 | 4/2018 | Pang et al. | |
| 2020/0381450 | A1 * | 12/2020 | Lue | ........ H01L 29/792 |
| 2021/0074726 | A1 * | 3/2021 | Lue | ........ G11C 11/223 |

FOREIGN PATENT DOCUMENTS

| TW | I677120 | 11/2019 |
| TW | 202038440 | 10/2020 |

OTHER PUBLICATIONS

"Office Action of Taiwan Counterpart Application", dated Apr. 13, 2021, pp. 1-5.

(Continued)

*Primary Examiner* — Allison Bernstein
(74) *Attorney, Agent, or Firm* — J.C. Patents

(57) ABSTRACT

Provided is a flash memory includes a gate stack structure, a channel pillar, a first conductive pillar, a second conductive pillar, and a gate dielectric layer. The gate stack structure includes a plurality of gate layers electrically insulated from each other. Each gate layer includes a ferroelectric portion disposed between a sidewall of a first portion and a sidewall of a second gate portion. A thickness of the second gate portion is smaller than a thickness of the first gate portion. A channel pillar penetrates the gate stack structure. The first and second conductive pillars are disposed in the channel pillar. The first and second conductive pillars are separated from each other, and are each connected to the channel pillar. The gate dielectric layer is disposed between another sidewall of the first gate portion and the channel pillar.

20 Claims, 34 Drawing Sheets

(56) References Cited

OTHER PUBLICATIONS

Hang-Ting Lue et al., "Device Modeling of Ferroelectric Memory Field-Effect Transistor (FeMFET)," IEEE Transactions on Electron Devices, vol. 49, Issue 10, Oct. 2002, pp. 1790-1798.
Halid Mulaosmanovic et al., "Ferroelectric FETs With 20-nm-Thick HfO2 Layer for Large Memory Window and High Performance," IEEE Transactions on Electron Devices, vol. 66, Issue 9, Sep. 2019, pp. 3828-3833.

* cited by examiner

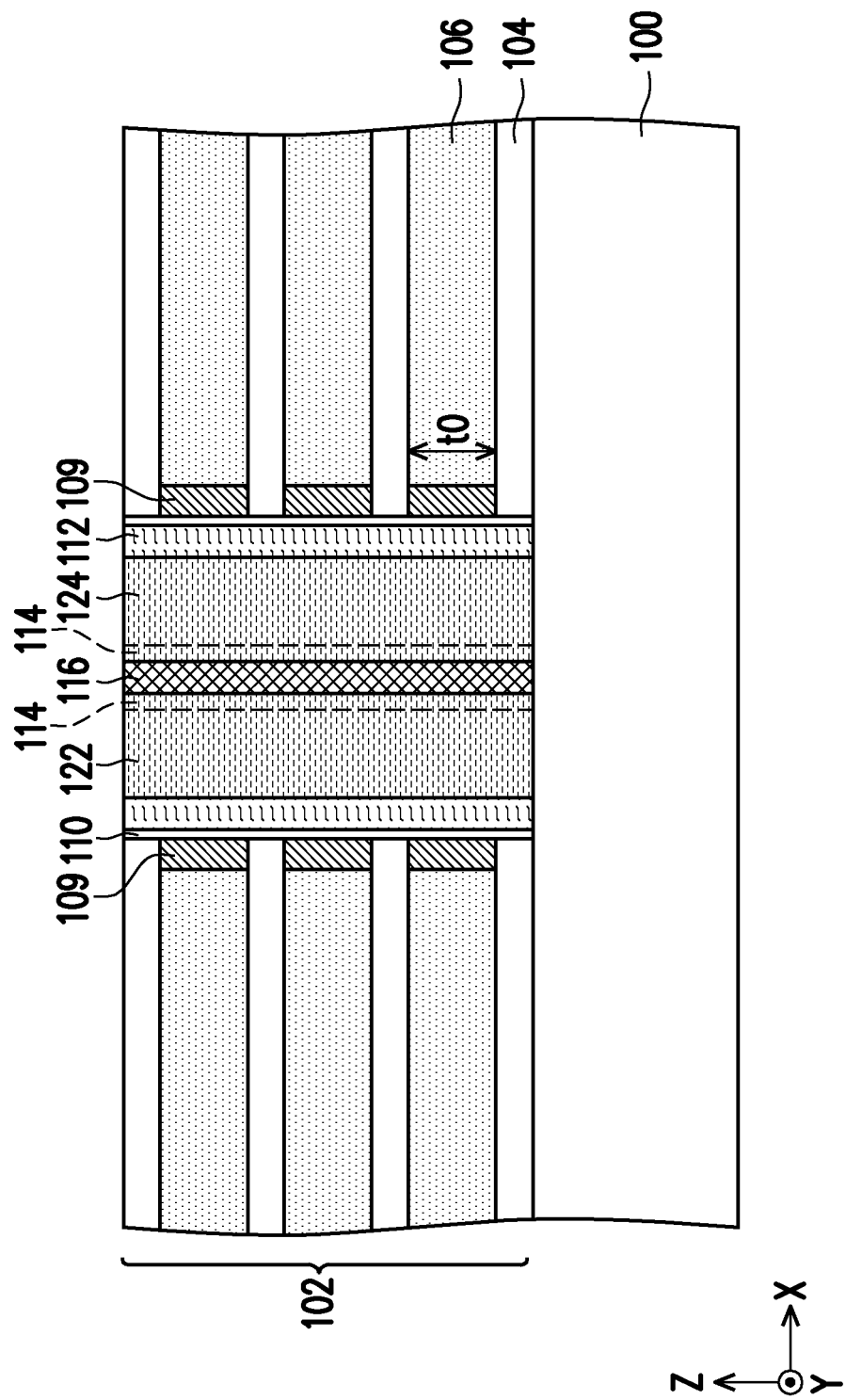

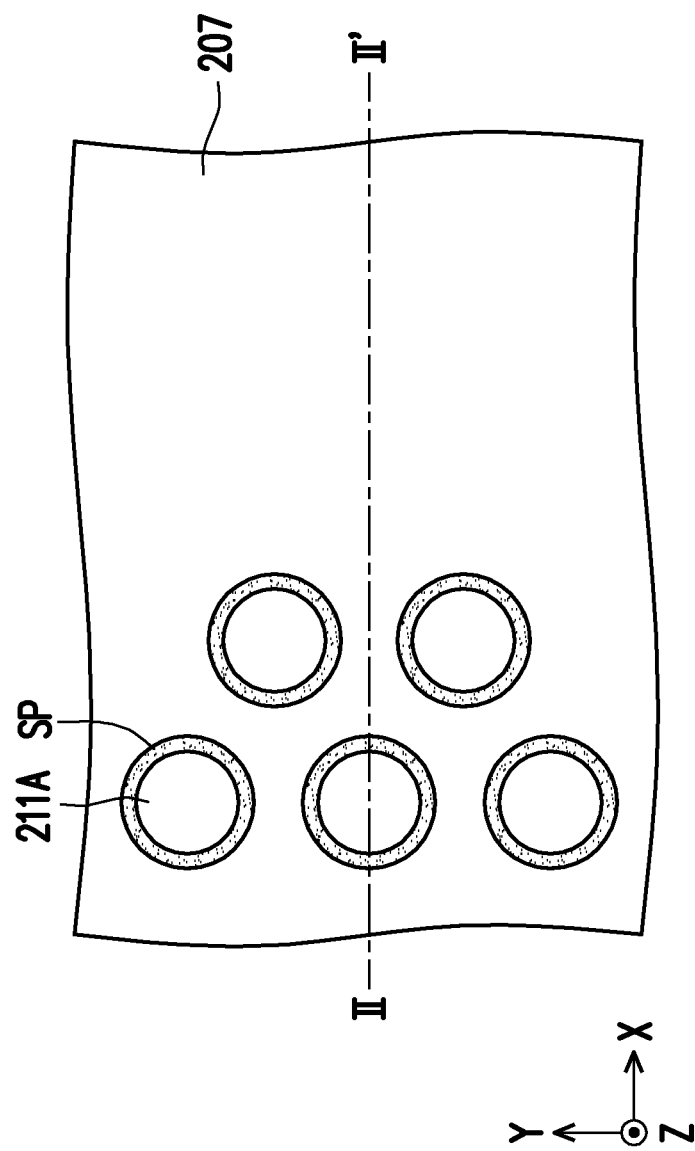

FLASH MEMORY AND METHOD OF FABRICATING THE SAME

TECHNICAL FIELD

The invention relates to a non-volatile memory and a method of fabricating the same, and more particularly, relates to a flash memory and a method of fabricating the same.

BACKGROUND

A non-volatile memory (such as a flash memory) is a memory widely used in personal computers and other electronic devices because it has an advantage that the stored data does not disappear after being powered off.

The 3D flash memory currently used in the industry includes a NOR flash memory and a NAND type flash memory. In addition, another type of 3D flash memory is an AND type flash memory, which can be applied to a multi-dimensional flash memory array with high integration and high area utilization, and has an advantage of fast operation speed. Therefore, the development of the 3D flash memory has gradually become the current trend.

SUMMARY

The embodiment of the invention provides a flash memory with a ferroelectric portion and a double-gate, which may avoid from the effect of tunneling injecting of the gate dielectric layer due to excessive difference between the dielectric constants of the ferroelectric portion and the gate dielectric layer, thereby improving the efficiency of reading and writing operations.

The invention provides a flash memory, comprising: a gate stack structure disposed on a dielectric base and includes a plurality of gate layers electrically insulated from each other, each gate layer comprising: a first gate portion; a second gate portion disposed adjacent to a sidewall of the first gate portion, wherein a thickness of the second gate portion is smaller than a thickness of the first gate portion; a ferroelectric portion disposed between the sidewall of the first gate portion and a sidewall of the second gate portion; and a channel pillar arranged on the dielectric base and penetrating the gate stack structure; a first conductive pillar, and a second conductive pillar connected to the channel pillar and penetrating the gate stack structure, wherein the first conductive pillar, and the second conductive pillar are separated from each other; and a gate dielectric layer disposed between another sidewall of the first gate portion and a sidewall of the channel pillar.

The embodiment of the present invention also provides another flash memory, comprising: a gate stack structure disposed on a substrate, comprising: a first gate layer, comprising: a first gate portion; a second gate portion disposed adjacent to a sidewall of the first gate portion, wherein a thickness of the second gate portion is smaller than a thickness of the first gate portion; and a ferroelectric portion disposed between the sidewall of the first gate portion and a sidewall of the second gate portion; and a second gate layer located between the first gate layer and the substrate, and electrically insulated from the substrate and the first gate layer; a channel structure penetrating the gate stack structure and electrically connected to the substrate; a first gate dielectric layer disposed between a sidewall of the channel structure and another sidewall of the first gate portion; and a second gate dielectric layer disposed between the sidewall of the channel structure and a sidewall of the second gate layer.

The embodiment of the present invention provides a method of fabricating flash memory, comprising: forming an insulating stack structure on the dielectric base, the insulating stack structure comprising a plurality of insulating layers and a plurality of sacrificial layers alternately with each other; forming an opening in the insulating stack structure; removing portions of the plurality of sacrificial layers exposed by the opening so as to form a plurality of recesses; forming a plurality of first gate portions in the plurality of recesses; forming a gate dielectric layer on a sidewall of the opening to cover the plurality of first gate portions and the plurality of insulating layers; forming a channel layer in the opening to cover a sidewall of the gate dielectric layer; forming a first conductive pillar and a second conductive pillar in the openings, wherein the first conductive pillar and the second conductive pillar are separated from each other and electrically connected to the channel layer respectively; removing the plurality of sacrificial layers to form a plurality of lateral openings; forming a ferroelectric portion in each of the plurality of lateral openings to cover another sidewall of a corresponding first gate layer, and a top surface and a bottom surface of a corresponding lateral openings; and forming a second gate portion in each lateral opening, wherein a sidewall, a top surface, and a bottom surface of the second gate portion are covered by the ferroelectric portion.

Based on the above, according to the flash memory of the embodiment of the present invention, the effect of tunnel injection caused by excessive electric field across the gate dielectric layer may be avoided, and the problem of capacitance mismatch between the first capacitor and second capacitor capacitance caused by excessive difference in the dielectric constant between the gate dielectric layer and the ferroelectric portion can be improved. Therefore, the embodiment of the present invention can not only improve the efficiency of reading and writing, and improve the reliability of flash memory, but also have a larger memory window.

In addition, in the flash memory fabricating method of the embodiment of the present invention, the design of the thickness of the gate dielectric layer, the floating gate, the control gate layer and ferroelectric portion may be used to easily adjust the ratio of the coupling area of the first capacitor to the coupling area of the second capacitor.

To make the aforementioned more comprehensible, several embodiments accompanied with drawings are described in detail as follows.

BRIEF DESCRIPTION OF THE DRAWINGS

FIGS. 2A to 2H are schematic cross-sectional views of the fabricating process of the 3D flash memory taken along line II-II' in FIG. 1A.

FIGS. 4A to 4K are schematic top views of the fabricating process of flash memory with a vertical two transistors (2T) according to a second embodiment of the invention.

DESCRIPTION OF THE EMBODIMENTS

Figure 1A:
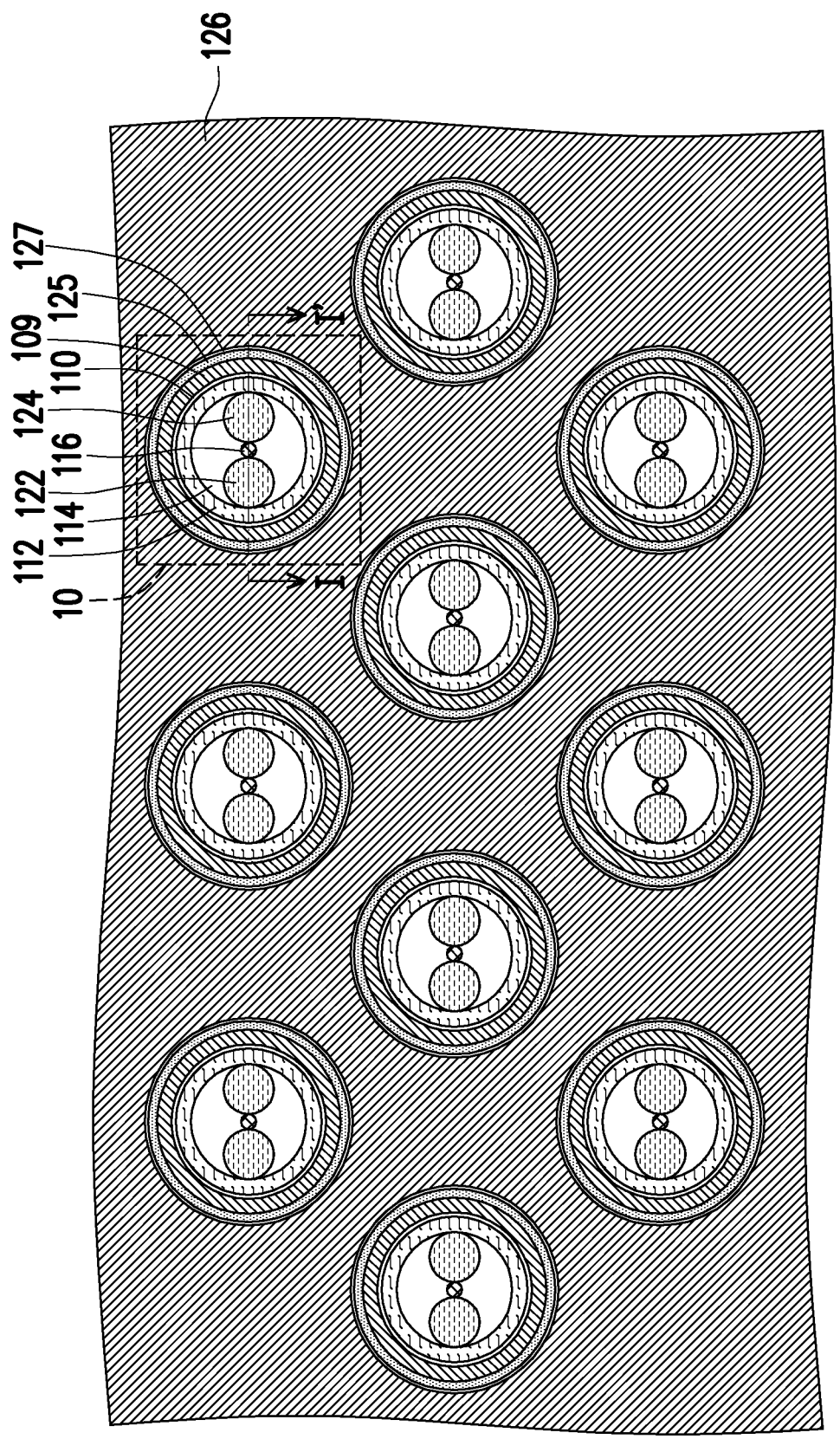
FIG. 1A is a schematic top view of a three-dimensional (3D) flash memory according to a first embodiment of the invention.
Figure 1B:
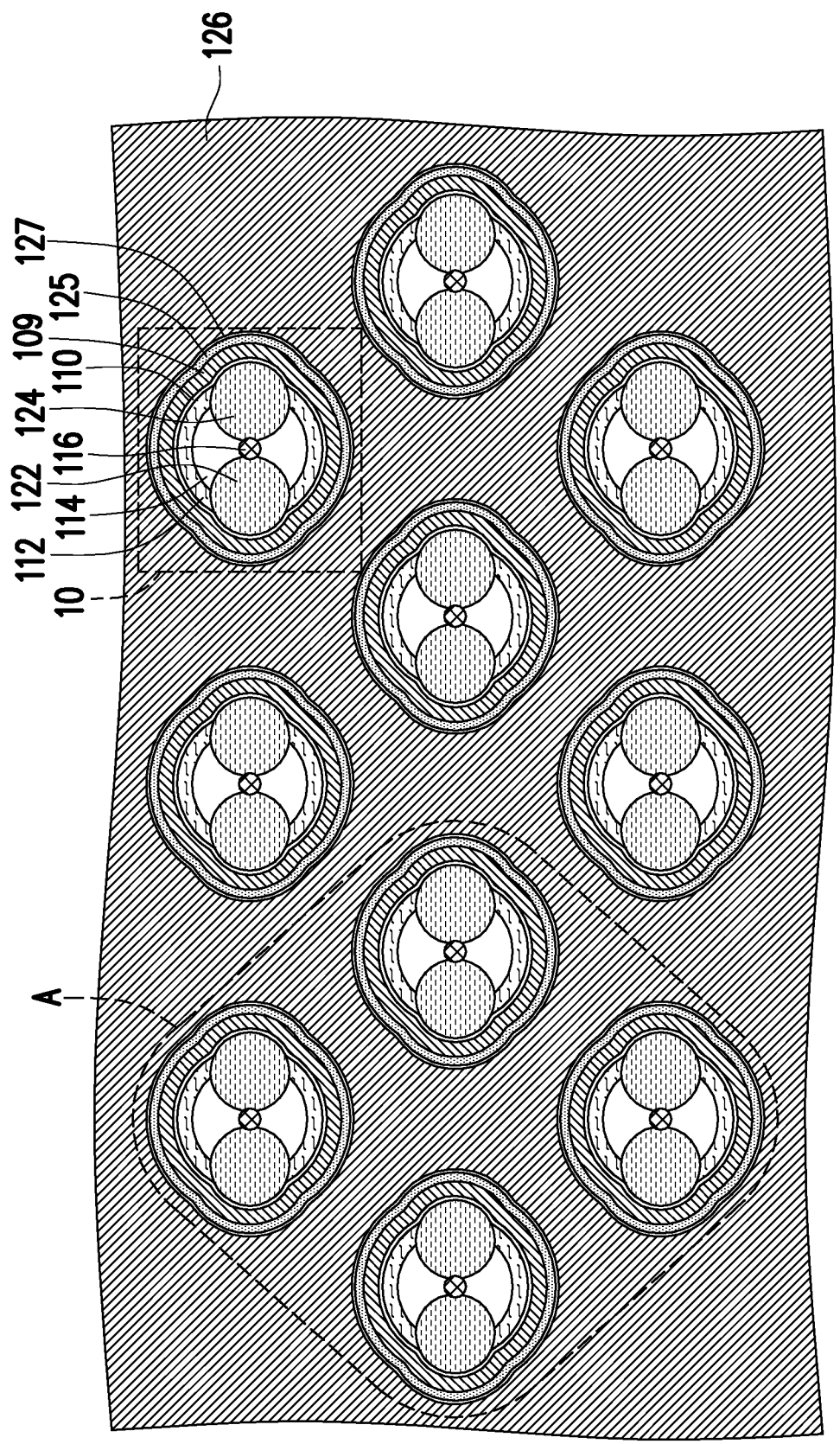
FIG. 1B is a schematic top view of a 3D flash memory according to an embodiment of the invention.
Figure 1C:
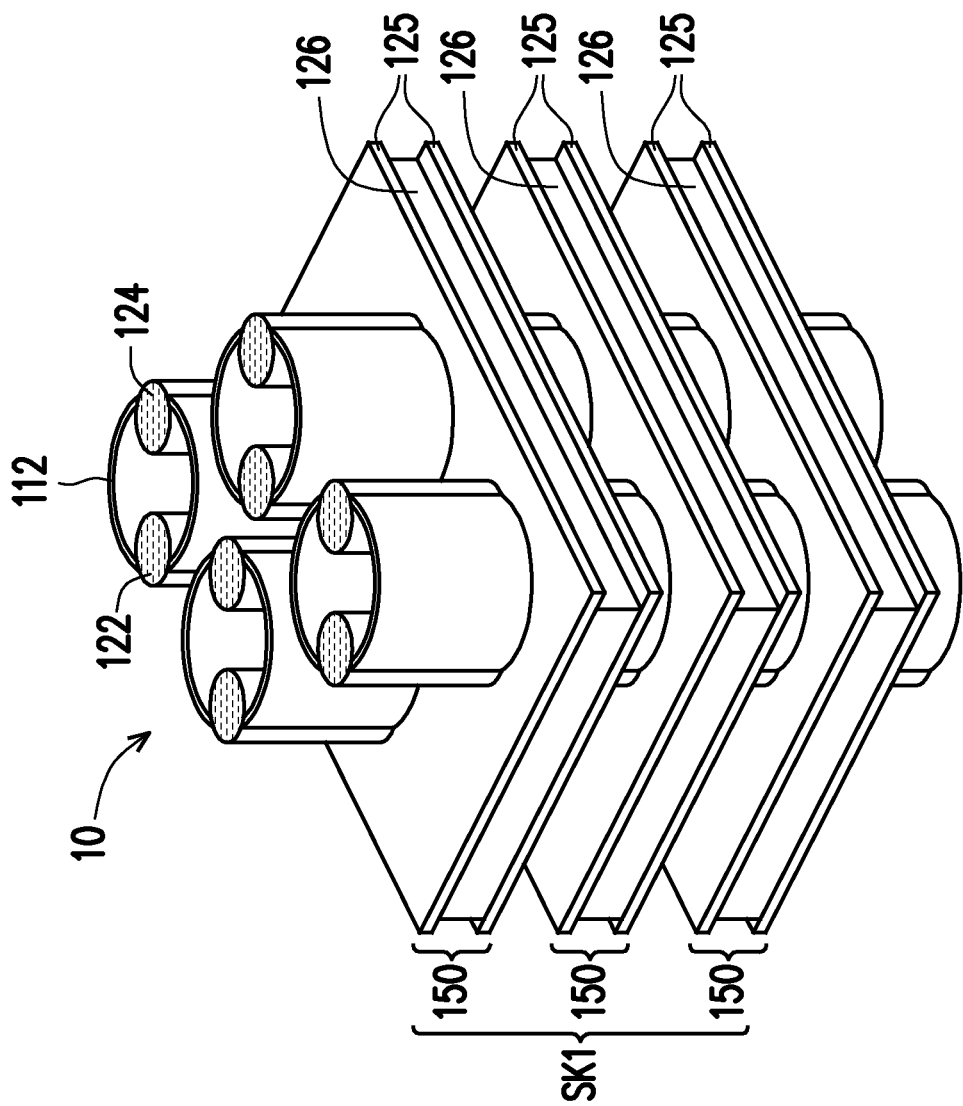
FIG. 1C is a perspective view of several 3D flash memories in region A shown in FIG. 1B.
Figure 2H:
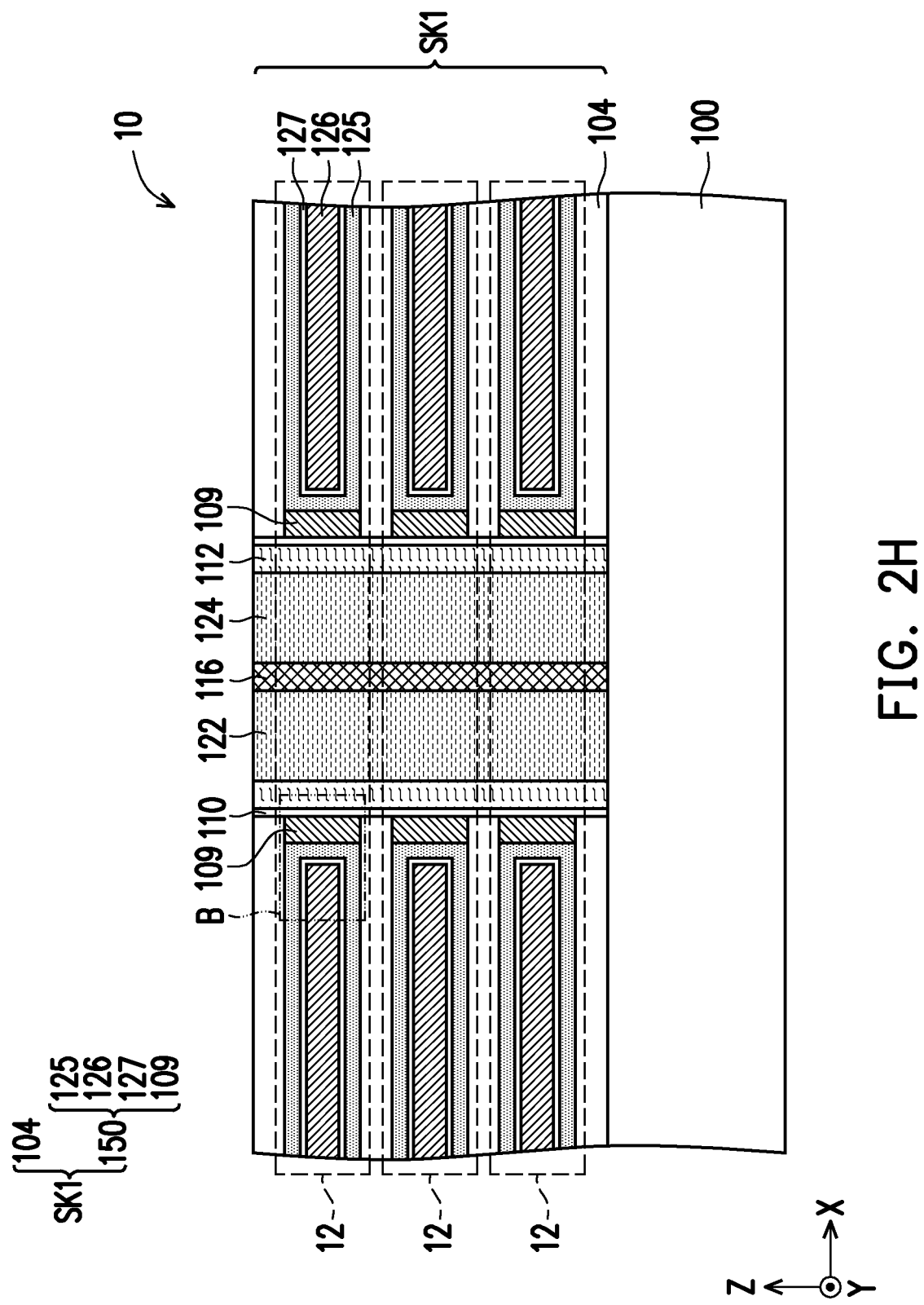
Figure 3:
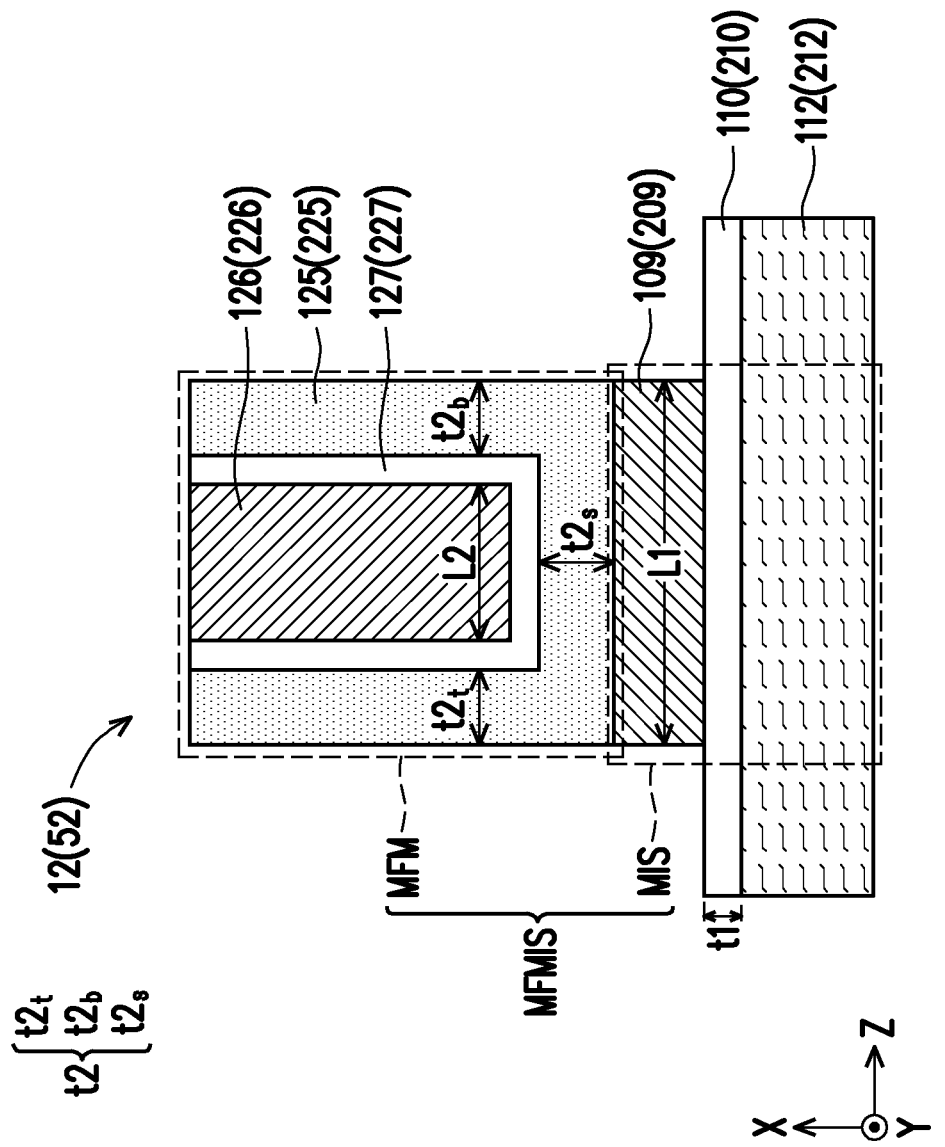
FIG. 3 is an enlarged schematic view of the memory cell shown in a region B of FIG. 2H or a region B' of FIG. 5K and rotated by 90 degrees.

FIG. 1A is a schematic top view of a 3D flash memory according to the first embodiment of the present invention. FIG. 1B is a schematic top view of a 3D flash memory according to one of the embodiments of the present invention. FIG. 1C is a perspective view of the 3D flash memory in region A in FIG. 1B. The cross-sectional schematic diagram of the line I-I' of FIG. 1A is shown in FIG. 2H. FIG. 3 is an enlarged schematic view of the memory cell of region B in FIG. 2H which are rotated by 90 degrees.

Referring to FIGS. 1A, 1B, and 1C, in the present embodiment, a 3D flash memory includes stacked memory structure 10. The stacked memory structure 10 may be arranged in an array. In FIG. 1A or FIG. 1B, the 3D flash memory has ten stacked memory structure 10 arranged in an array. In the array, the odd-numbered stacked memory structures 10 are aligned with each other, the even-numbered stacked memory structures 10 are aligned with each other, and the stacked memory structure 10 of two adjacent pillars are staggered with each other. In addition, the number, position, orientation, pitch, etc. of the stacked memory structure 10 are not limited to those shown in FIG. 1C.

FIGS. 1A, 1B, 1C, and 2H, each stack memory structure 10 includes a gate stack structure SK1 provided on a dielectric base 100 in the first embodiment. The gate stack structure SK1 includes gate layers 150 and insulating layers 104 that are alternately stacked with each other. The gate layers 150 adjacent to each other are separated from each other by an insulating layer 104. For the sake of clarity and simplicity, the insulating layer 104 and the dielectric base 100 are omitted in FIGS. 1A, 1B and 1C. In the present embodiment, the gate stack structure SK1 includes three gate layers 150 and four insulating layers 104. However, the present invention is not limited thereto. The gate stack structure SK1 may include three or more gate layer 150 and four or more insulating layers 104.

Each gate layer 150 includes a first gate portion 109, a second gate portion 126, and a ferroelectric portion 125. The first gate portion 109 can be used as a floating gate layer, and the second gate portion 126 can be used as a control gate layer. The ferroelectric portion 125 is sandwiched between the sidewall of the first gate portion 109 and the sidewall of the second gate portion 126, and forms a lateral sandwich structure therewith. Moreover, the ferroelectric portion 125 also extends to cover the top surface and the bottom surface of the second gate portion 126 to form a vertical sandwich structure. In some embodiments, each gate layer 150 further includes a barrier layer 127, which is disposed between the second gate portion 126 and the ferroelectric portion 125.

Each stack memory structure 10 of the 3D flash memory also includes a channel layer 112, a gate dielectric layer 110, a first conductive pillar 122 and a second conductive pillar 124. In some embodiments, the channel layer 112 is an annular channel pillar, which is disposed on the dielectric base 100 and is continuous in the extending direction thereof (for example, Z direction), and vertically penetrates the gate stack structure SK1. The annular channel pillar may be circular ring shaped, elliptical ring shaped, quadrangular ring shaped, or polygonal ring shaped, but not limited thereto. The outer sidewall of the channel layer 112 is surrounded by the first gate portion 109 and the insulating layer 104. In FIG. 2H, the X, Y, and Z directions are perpendicular to each other.

The gate dielectric layer 110 is disposed on the dielectric base 100, and is continuous in the extending direction thereof, and vertically penetrates the gate stack structure SK1. In addition, the gate dielectric layer 110 surrounds the outer sidewall of the channel layer 112. Moreover, the gate dielectric layer 110 is disposed between and in contact with the first gate portions 109 and the channel layers 112, and is disposed between and in contact with the insulating layers 104 and channel layers 112.

The first conductive pillars 122 and the second conductive pillars 124 may be referred to as first source/drain (S/D) pillars 122 and second source/drain (S/D) pillars 124, respectively. The first conductive pillar 122 and the second conductive pillar 124 are in contact with the channel layer 112.

In some embodiments, the first conductive pillar 122 and the second conductive pillar 124 are disposed on the dielectric base 100 and are located within the inner sidewall of the channel layer 112. Further, the first conductive pillar 122 and the second conductive pillar 124 are continuous in the extending direction thereof and penetrate the gate stack structure SK1. The sidewalls of the first conductive pillar 122 and the second conductive pillar 124 are each connected to the sidewall of the channel layer 112, and the first conductive pillar 122 and the second conductive pillar 124 are separated from each other by an insulating pillar 116 as shown in FIG. 1A.

In alternative embodiments, the first conductive pillar 122 and the second conductive pillar 124 are configured to pass the channel layer 112 and protrude from the outer sidewall of the channel layer 112 as shown in FIGS. 1B and 1C. For clarity of the drawing, the insulating pillar 116 is omitted in FIG. 1C. In some embodiments, the first conductive pillar 122 and the second conductive pillar 124 respectively include a central portion and a peripheral portion surrounding the central portion, and the doping concentration of the central portion is greater than that of the peripheral portion. The doping concentration difference may be used for junction tuning.

Each gate layer 150, the gate dielectric layer 110, and the first conductive pillar 122 and second conductive pillar 124 surrounded thereby form a memory cell 12. In FIG. 2H, each stack of memory structure 10 has three memory cells 12 stacked in the vertical direction. However, the memory cell 12 of each stack memory structure 10 is not limited thereto. Each stack memory structure 10 may include more or less memory cells 12 stacked vertically.

Referring to FIG. 3, in the memory cell 12 of the stack memory structure 10, the second gate portion 126 as the control gate, the ferroelectric portion 125, and the first gate portion 109 as the floating gate 109 form a first capacitor MFM. The first gate portion 109 as the floating gate, the gate dielectric layer 110, and the channel layer 112 form a second capacitor MIS. The first capacitor MFM and second capacitor MIS are connected in series to form a capacitor MFMIS.

In the present embodiment, the coupling area $A_F$ of the first capacitor MFM refers to the overlapping area between the second gate portion 126, the ferroelectric portion 125, and the first gate portion 109 in the X direction, and the coupling area $A_I$ of the second capacitor MIS refers to the overlapping area between the first gate portion 109, the gate dielectric layer 110, and the channel layer 112 in the X direction. The coupling area $A_F$ of the first capacitor MFM is related to the thickness L2 of the second gate portion 126, and the coupling area $A_I$ of the second capacitor MIS is related to the thickness L1 of the first gate portion 109. Since the thickness L2 of the second gate portion 126 is smaller than the thickness L1 of the first gate portion 109, the coupling area $A_F$ of the first capacitor MFM is smaller than the coupling area $A_I$ of the second capacitor MIS. The coupling area ratio $R_A$ of the coupling area $A_F$ to the coupling area $A_I$ is related to the dielectric constants of the ferroelectric portion 125 and the first gate portion 109. When the dielectric constant ratio $R_D$ of the ferroelectric portion 125 to the first gate portion 109 is larger (greater than 1), the coupling area ratio $R_A$ of the coupling area $A_F$ to the coupling area $A_I$ may be adjusted to be smaller (less than 1) by the control of the process. When the dielectric constant ratio $R_D$ of the ferroelectric portion 125 to the first gate portion 109 is closer to 1, the coupling area ratio $R_A$ of the coupling area $A_F$ to the coupling area $A_I$ may be adjusted to be closer to 1 by the control of the process. In some embodiments, the dielectric constant ratio $R_D$ is greater than or equal to 1, and the coupling area ratio $R_A$ is less than 1, or even less than 0.6. In some examples, the coupling area ratio $R_A$ is between 0.2 and 0.5.

Compared with the second capacitor MIS, since the first capacitor MFM has a smaller coupling area $A_F$, the first capacitor MFM will have a larger voltage across thereon during read and write operations, which can reduce electric field across the second capacitor MIS. Therefore, the effect of the tunneling through and inject into the gate dielectric layer 110 caused by an excessive electric field can be avoided, thereby improving the efficiency of reading and writing, improving the reliability of the device, and increasing the memory window. In some embodiments, the coupling area ratio $R_A$ of the coupling area $A_F$ to the coupling area $A_I$ is less than 0.5, and the memory window can be greater than 4 volts.

In the embodiment of the present invention, the problem that the capacity mismatch between the second capacitor MIS and the first capacitor MFM can be improved by controlling the coupling area ratio $R_A$ of the coupling area $A_F$ and the coupling area $A_I$, thereby improving the reliability of the flash memory.

The above 3D flash memory can be manufactured according to the method of FIGS. 2A to 2H, which will be described in detail below.

Figure 2A:
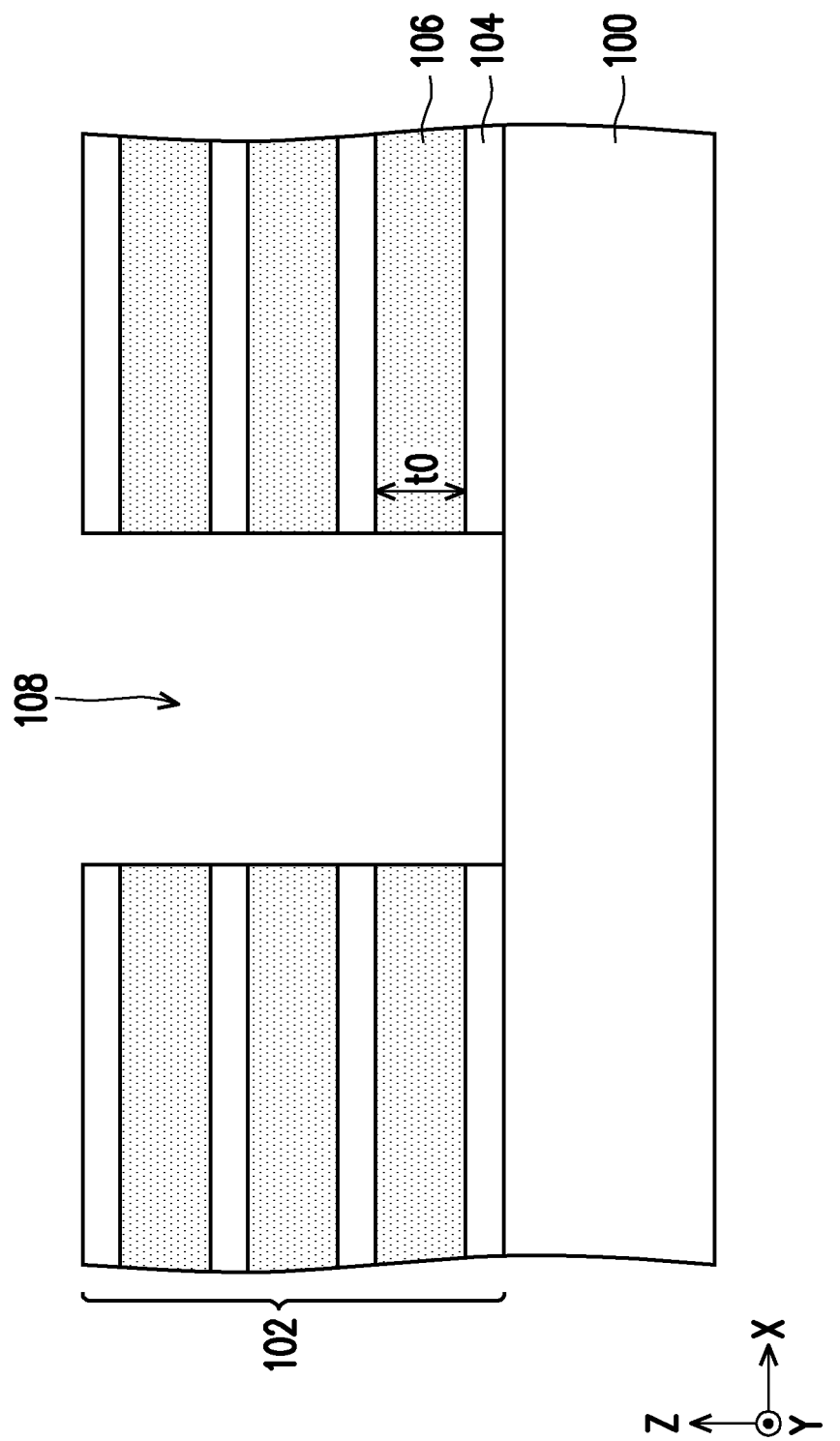

Referring to FIG. 2A, a stack structure 102 is formed on a dielectric base 100. The stack structure 102 may also be referred to as an insulating stack structure 102. The dielectric base 100 is, for example, a dielectric layer formed on a silicon substrate, such as a silicon oxide layer. In the present embodiment, the stack structure 102 is composed of an insulating layer 104 and a sacrificial layer 106 that are sequentially stacked on the dielectric base 100. In other embodiments, the stack structure 102 may be composed of a sacrificial layer 106 and an insulating layer 104 that are sequentially stacked on the dielectric base 100. In addition, in the present embodiment, the uppermost layer of the stack structure 102 is the insulating layer 104. The insulating layer 104 is, for example, a silicon oxide layer. The sacrificial layer 106 is, for example, a silicon nitride layer. In the present embodiment, the stack structure 102 has four insulating layers 104 and three sacrificial layers 106, but the invention is not limited thereto. In other embodiments, more insulating layer 104 and more sacrificial layer 106 may be formed according to actual requirements. The thickness t0 of the sacrificial layer 106 is related to the thicknesses of the first gate portion 109, the ferroelectric portion 125, and the second gate portion 126 to be formed later. In some embodiments, the thickness t0 of the sacrificial layer 106 may range from 20 nm to 200 nm, for example, about 80 nm.

An opening 108 is formed in the stack structure 102. In the present embodiment, the bottom surface of the opening 108 exposes the dielectric base 100, but the present invention is not limited thereto. In other embodiments, when the lowest layer of the stack structure 102 is the insulating layer 104, the bottom of the opening 108 is located in the lowest layer of the insulating layer 104. That is, the bottom surface of the opening 108 exposes the lowermost insulating layer 104, but the dielectric base 100 is not exposed. Alternatively, in other embodiments, the bottom of the opening 108 extends into the dielectric base 100. In the present embodiment, from the above perspective, the opening 108 has a circular profile, but the present invention is not limited thereto. In other embodiments, the opening 108 may have a profile of other shapes, such as a polygon.

Figure 2B:
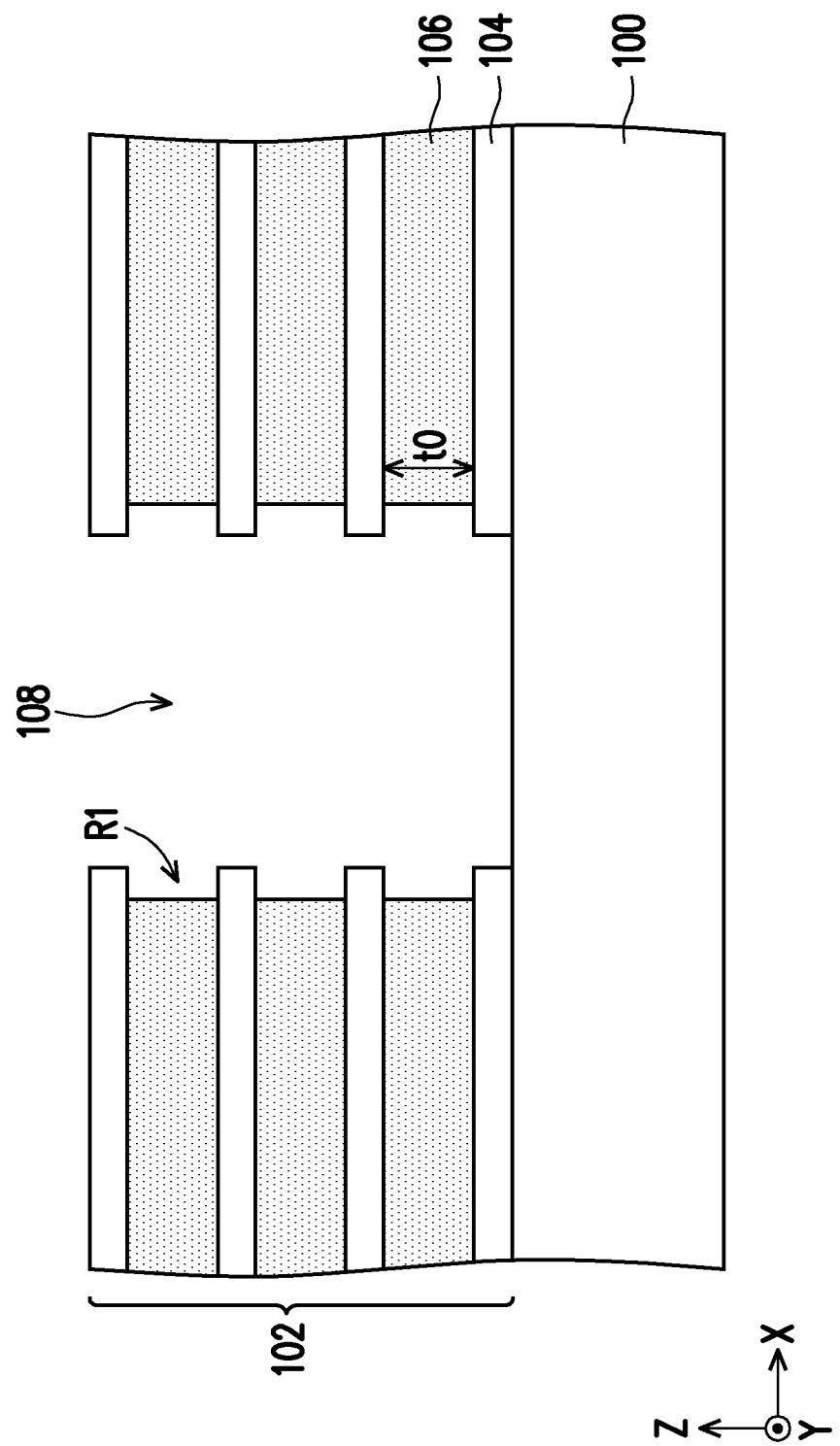

Referring to FIG. 2B, a pull-back process is performed to laterally etch the sacrificial layers 106 to form a plurality of recesses R1 at the end of the sacrificial layers 106. The pull-back process may be isotropic etching, anisotropic etching, or a combination thereof.

Figure 2C:
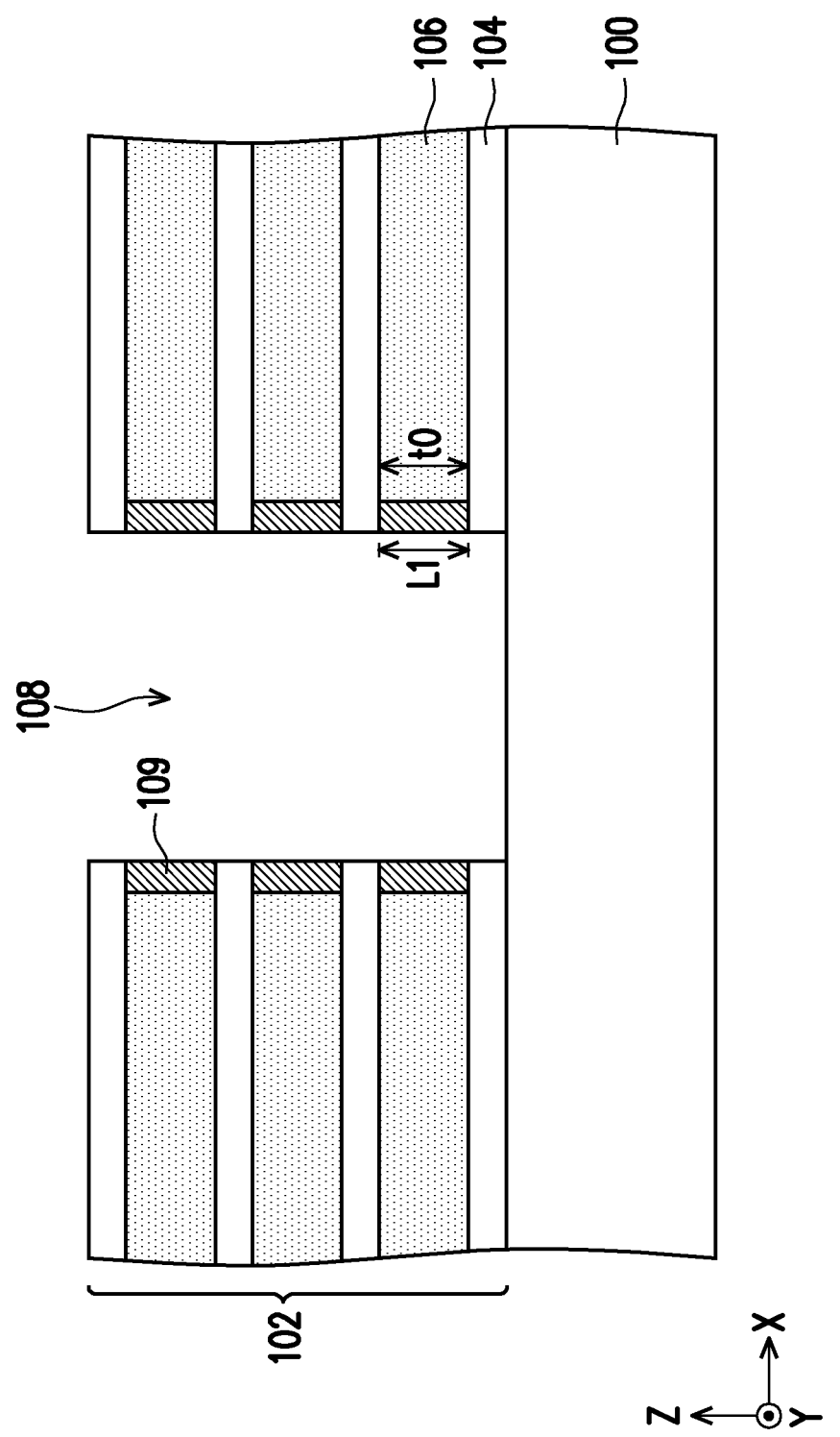

Referring to FIG. 2C, first gate portions 109 are formed in the recesses R1. The first gate portions 109 are formed by, for example, forming a conductive layer to cover the top surface of the stack structure 102 and filling the opening 108 and the recesses R1. The material of the conductive layer is, for example, polysilicon, amorphous silicon, tungsten (W), cobalt (Co), aluminum (Al), tungsten silicide ($WSi_x$), or cobalt silicide ($CoSi_x$). In addition, in other embodiments, before forming the first gate portions 109, a buffer layer and a barrier layer may be sequentially formed in the recesses R1. Afterwards, a pull-back process, such as an anisotropic etching process, is performed to remove the conductive layer other than the recess R1, so that the top surface of the stack structure 102, the sidewall of the insulating layer 104 and the bottom surface of the opening 108 is exposed, and thereby forming the first gate portions 109 separated from each other. Since the first gate portion 109 is formed in the recess R1, and the height of the recess R1 is approximately equal to the thickness t0 of the sacrificial layer 106, the thickness L1 of the first gate portion 109 may be adjusted by changing the thickness t0 of the sacrificial layer 106.

Referring to FIGS. 2C and 3, when the thickness t0 of the sacrificial layer 106 is larger, the thickness L1 of the first gate portion 109 is larger. Therefore, the larger coupling area $A_I$ of the second capacitor MIS is formed, and the coupling area ratio $R_A$ of the coupling area $A_F$ of the first capacitor MFM to the coupling area $A_I$ of the second capacitor MIS is smaller. When the thickness t0 of the sacrificial layer 106 is smaller, the thickness L1 of the first gate portion 109 is smaller. Therefore, the smaller the coupling area $A_I$ of the second capacitor MIS is formed, and the coupling area ratio $R_A$ of the coupling area $A_F$ of the first capacitor MFM to the coupling area $A_I$ of the second capacitor MIS is larger.

Figure 2D:
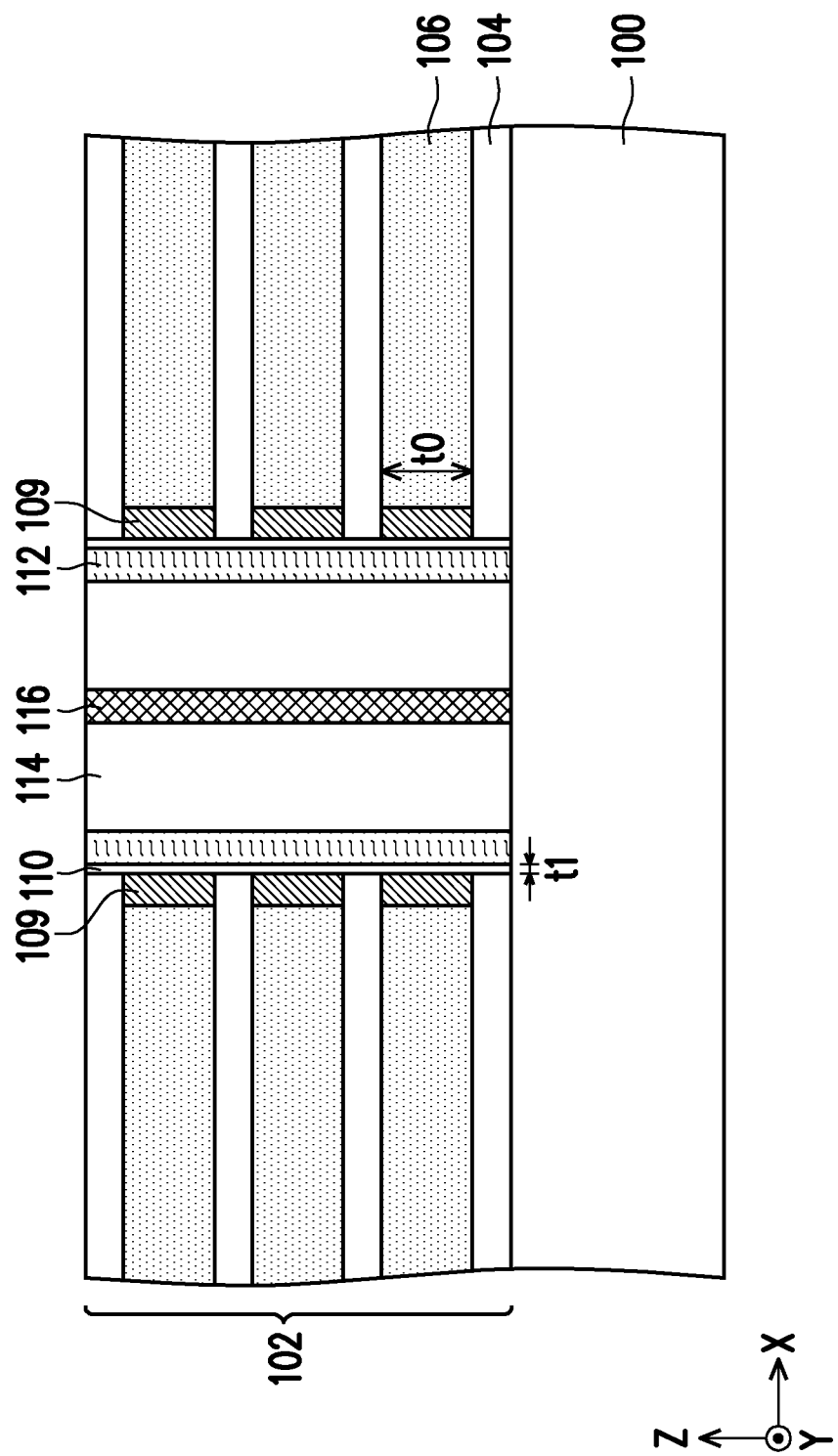

Referring to FIG. 2D, a gate dielectric layer 110 is formed on the inner surface of the opening 108. The gate dielectric layer 110 is formed by, for example, forming a gate dielectric material layer to cover the top surface of the stack structure 102 and filling the opening 108 to cover the insulating layer 104 and the first gate portion 109. The material of the gate dielectric material layer is, for example, silicon oxide, silicon oxynitride or a combination thereof. After that, an anisotropic etching process is performed to remove the excess gate dielectric material layer, so that the top surface of the stack structure 102 and the bottom surface of the opening 108 are exposed. The thickness t1 of the gate dielectric layer 110 is, for example, 2 nm to 10 nm.

A channel layer 112 is formed on the sidewall of the gate dielectric layer 110. The channel layer 112 is, for example, an undoped polysilicon layer. The method for forming the channel layer 112 is, for example, to form a channel material layer on the top surface of the stack structure 102 and the inner surface and bottom of the opening 108. Then, an anisotropic etching process is performed to remove the channel material layer on the top surface of the stack structure 102 and the bottom surface of the opening 108. In the present embodiment, since the channel layer 112 is formed on the inner surface of the opening 108, the channel layer 112 may also be referred to as an annular channel pillar 112 or an annular channel layer 112. The channel layer 112 is continuous in the extending direction thereof (between the top and bottom of the opening 108). In the present embodiment, since the opening 108 has a circular profile from the top view, the channel pillar also has a circular profile from the top view, but the present invention is not limited thereto. In other embodiments, depending on the shape of the opening 108, the channel pillar 112 may also have profiles of other shapes (such as polygons) from the top view. In addition, the gate dielectric layer 110 is located between the channel layer 112 and the inner surface of the opening 108, and thus covers the outer surface of the channel pillar (channel layer 112).

An insulating filling layer 114 is formed in the opening 108. The insulating filling layer 114 is, for example, a silicon oxide layer. The formation method of the insulating filling layer 114 is, for example, performing a chemical vapor deposition process to form an insulating material layer covering the top surface of the stack structure 102, the sidewalls of the channel layer 112, and the bottom surface of the opening 108. Then, an etching back process is performed to expose the top surface of the stack structure 102 and the bottom surface of the opening 108. The insulating filling layer 114 does not fill up the opening 108, but retains the central portion of the opening 108. After that, an insulating pillar 116 is formed in the opening 108 to fill the central portion of the opening 108. The materials of the insulating pillar 116 and the insulating filling layer 114 have different etch rates. In some embodiments, the material of the insulating pillar 116 is, for example, a silicon nitride layer, different from that of the insulating filling layer 114. The formation method of the insulating pillar 116 is, for example, a chemical vapor deposition process. In other embodiments, the opening 108 may be filled with the insulating filling layer 114 first, and then an opening that exposes the dielectric base 100 is formed in the insulating filling layer 114, and the opening is filled with the insulating pillar 116.

Figure 2E:
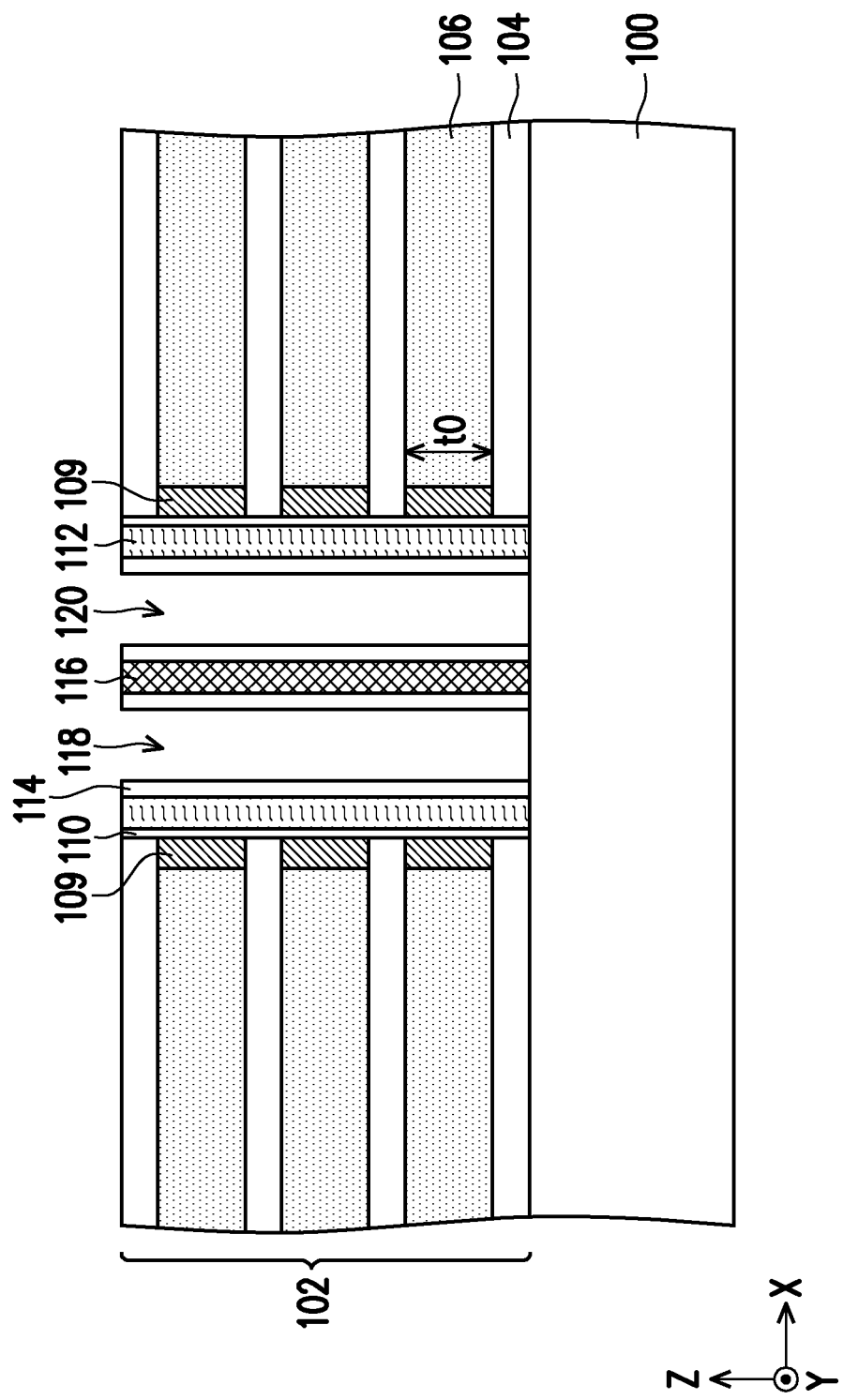

Referring to FIG. 2E, a contact hole 118 and a contact hole 120 are formed in the insulating filling layer 114. The bottom surfaces of the contact hole 118 and the contact hole 120 expose the dielectric base 100. In the present embodiment, from the top view, the contact hole 118 and the contact hole 120 have a circular profile, but the present invention is not limited thereto. In other embodiments, the contact hole 118 and the contact hole 120 may have profiles of other shapes, such as polygons. In the present embodiment, contact hole 118 and the contact hole 120 are respectively formed on two opposite sides of the insulating pillar 116 and are not in contact with the insulating pillar 116 and the channel layer 112, but the invention is not limited thereto. In other embodiments, contact hole 118 and the contact hole 120 may be in contact with the insulating pillar 116 and/or the channel layer 112. The contact hole 118 and the contact hole 120 are configured to define a position of a source/drain of the 3D flash memory of the present embodiment.

Referring to FIG. 2F, a hole expansion process is performed to expand the size of the contact hole 118 and the contact hole 120. In some embodiments, the contact hole 118 and the contact hole 120 respectively expose the insulating pillar 116 and the channel layer 112. In alternative embodiments, the contact hole 118 and the contact hole 120 respectively expose the channel layer 112, but do not expose the insulating pillar 116. The sidewall of the insulating pillar 116 is covered with the remaining insulating filling layer 114 (as shown in dotted line). In the present embodiment, a method of expanding the dimension of contact hole 118 and contact hole 120 is, for example, an isotropic etching process on the contact hole 118 and the contact hole 120. In particular, during the isotropic etching process, the insulating pillar 116 (silicon nitride layer) and the channel layer 112 (polysilicon layer) are used as the etch stop layer, and the insulating filling layer 114 around the contact hole 118 and the contact hole 120 (silicon oxide layer) is removed, and the insulating filling layer 114 (silicon oxide layer) other than around the contact hole 118 and contact hole 120 is left (as shown in FIG. 1A or 1B). In this way, the expanded contact hole 118 and the expanded contact hole 120 may be in contact with the insulating pillar 116 and the channel layer 112. Then, doped polysilicon layers are formed in the expanded contact hole 118 and the expanded contact hole 120 to form the first conductive pillar 122 and the second conductive pillar 124 of the 3D flash memory of the present embodiment. In this way, the first conductive pillar 122 and the second conductive pillar 124 are electrically connected to the channel pillar 112. In some embodiment, the first conductive pillar 122 and the second conductive pillar 124 may be separated from each other by the insulating pillar 116. In alternative embodiments, the first conductive pillar 122 and the second conductive pillar 124 may be separated from each other by the insulating pillar 116 and the remaining insulating filling layer 114.

Figure 2G:
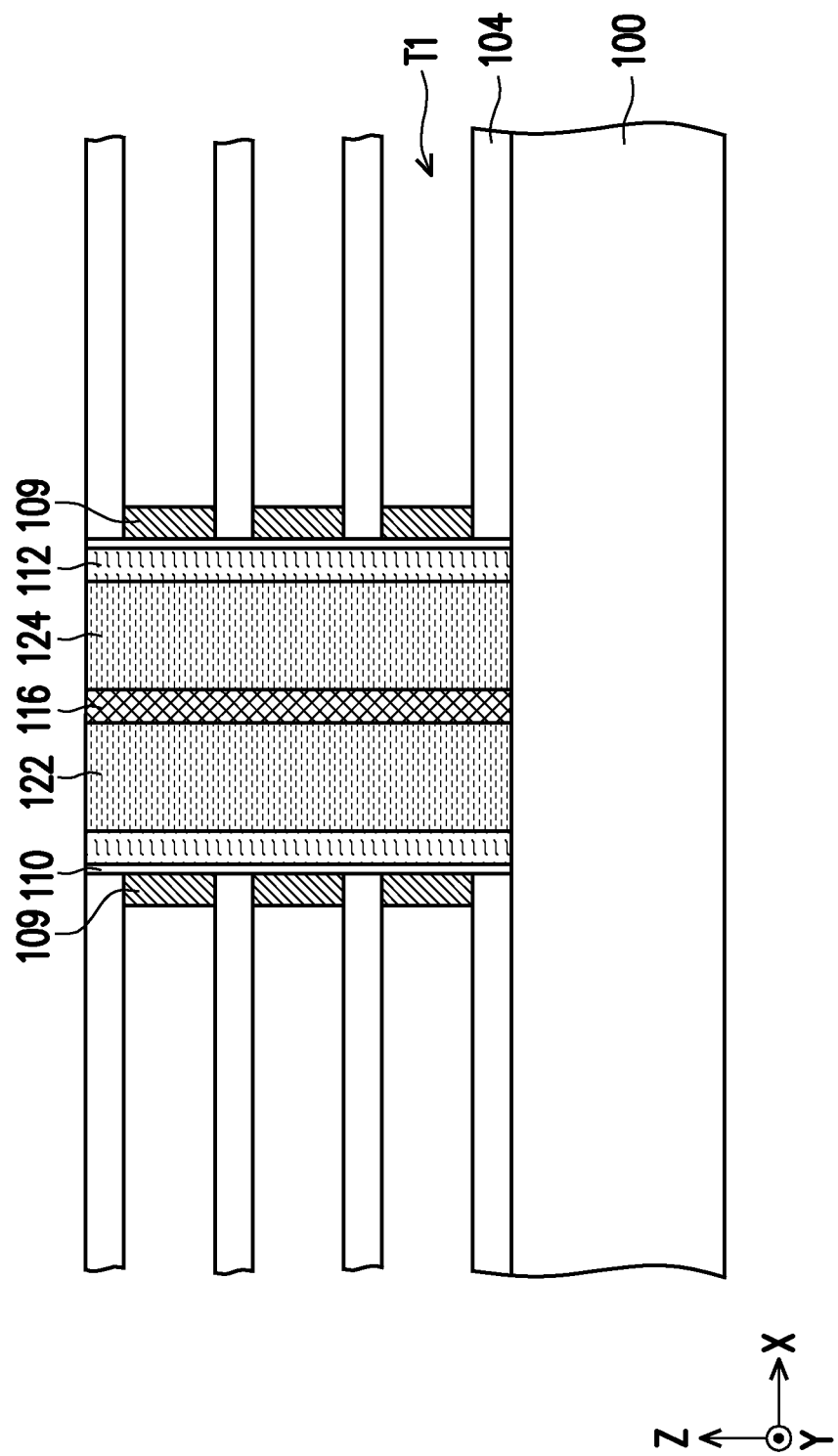

Referring to FIG. 2G, the sacrificial layer 106 in the stack structure 102 is removed to form a lateral opening T1 between adjacent insulating layers 104. The lateral opening T1 exposes the first gate portion 109 and the insulating layer 104. The method of removing the sacrificial layer 106 is, for example, to form a slit opening (not shown) in the stack structure 102, and then perform an selective etching process through the slit opening to remove the sacrificial layers 106 without unignorable consume of the insulating layers 104.

Referring to FIG. 2H, after removing the sacrificial layer 106, a ferroelectric portion 125 and a second gate portion 126 are formed in the formed lateral opening T1. The ferroelectric portion 125 does not fill the lateral opening T1, and the second gate portion 126 fills the remaining space of the lateral opening T1. The ferroelectric portion 125 covers the sidewall, the top surface and the bottom surface of the lateral opening T1. The dielectric constant of the ferroelectric portion 125 is equal to or greater than the dielectric constant of the gate dielectric layer 110. In some embodiments, the ratio of the dielectric constant of the ferroelectric portion 125 to the dielectric constant of the gate dielectric layer 110 is between 1 to 7. The ferroelectric portion 125 is, for example, hafnium oxide ($HfO_2$) doped with Al, Si, Zr, La, Gd, Y, or a combination thereof. The second gate portion 126 may also be referred to as a control gate layer. The material of the second gate portion 126 is, for example, polysilicon, amorphous silicon, tungsten (W), cobalt (Co), aluminum (Al), tungsten silicide ($WSi_x$), or cobalt silicide (CoSi$_x$). In addition, in other embodiments, after the ferroelectric portion 125 is formed and before the second gate portion 126 is formed, a barrier layer 127 may be sequentially formed in the lateral opening T1. The material of the barrier layer 127 is, for example, titanium (Ti), titanium nitride (TiN), tantalum (Ta), tantalum nitride (TaN), or a combination thereof.

The formation method of the ferroelectric portion 125, the barrier layer 127, and the second gate portion 126 are as follows. A ferroelectric material layer is formed in the lateral opening T2 and slit opening. The formation method of the ferroelectric material layer is, for example, CVD. The ferroelectric material layer does not fill up the lateral opening T1. After forming the ferroelectric material layer, a barrier layer and a gate material layer are formed on the ferroelectric material layer and in the remaining space of the lateral opening T1. Thereafter, an etch back process is performed to remove the ferroelectric material layer, barrier layer and gate material layer other than the lateral opening T1 so as to form the ferroelectric portion 125, barrier layer 127 and second gate portion 126.

Referring to FIG. 3, in some embodiments, the ferroelectric portion 125 covers the top surface of the second gate portion 126 and has a thickness t2$_t$. The ferroelectric portion 125 covering the bottom surface of the second gate portion 126 has a thickness t2$_b$. The ferroelectric portion 125 covering the sidewall of the second gate portion 126 has a thickness t2$_s$. The average thickness of the thickness t2$_t$, the thickness t2$_b$, and the thickness t2$_s$ is t2. In some embodiments, the ferroelectric portion 125 is a conformal layer, uniformly conformally covering the sidewall, the top surface, and the bottom surface of the lateral opening T1. That is, the thickness t2$_t$, the thickness t2$_b$, and the thickness t2$_s$ are substantially equal. When the thickness t2 of the ferroelectric portion 125 is larger, the thickness L2 of the second gate portion 126 is smaller, and the smaller the coupling area A$_F$ of the first capacitor MFM is formed. Therefore, the coupling area ratio R$_A$ of the coupling area A$_F$ of the first capacitor MFM to the coupling area A$_I$ of the second capacitor MIS is smaller. When the thickness t2 of the ferroelectric portion 125 is smaller, the thickness L2 of the second gate portion 126 is larger, and the larger the coupling area A$_F$ of the first capacitor MFM is formed. Therefore, the coupling area ratio R$_A$ of the coupling area A$_F$ of the first capacitor MFM to the coupling area A$_I$ of the second capacitor MIS is larger.

The thickness L2 of the second gate portion 126 may be determined by adjusting the thickness t2 of the ferroelectric portion 125 and the thickness t0 of the sacrificial layer 106. In some embodiments, the dielectric constant of the ferroelectric portion 125 ranges from 15 to 30, and the dielectric constant of the gate dielectric layer 110 ranges from 3.9 to 9. The thickness t0 of the sacrificial layer 106 and the thickness L1 of the first gate portion 109 range from 20 nm to 200 nm. The thickness t1 of the gate dielectric layer 110 ranges from 3 nm to 30 nm, for example, 5 nm. The thickness t2 of the ferroelectric portion 125 ranges from 10 nm to 50 nm, for example, 20 nm. The thickness L2 of the second gate portion 126 ranges from 20 nm to 150 nm, for example, 40 nm.

Thereafter, the metallization process and other subsequent processes may be performed. For example, when the first conductive pillar 122 are used as the source and the second conductive pillar 124 are used as the drain, the subsequent metallization process may form a source line to connect to the first conductive pillar 122, and form a bit line to connect to the second conductive pillar 124.

In particular, the 3D flash memory of the present invention is not limited to the structure of stack memory structure 10, and various other structures will be described below. In the following embodiments, the same device as the first embodiment will be denoted by the same device numeral and will not be described again.

On the other hand, when more layers of memory unit stack structures are required for high integration and high area utilization, a plurality of 3D flash memories of the invention may be stacked. For example, after the stack memory structure 10 as shown in FIG. 2H is formed, the manufacturing steps of the stack memory structure 10 may be repeated again one or more times, so that another or more stack memory structure 10 are stacked on the stack memory structure 10. In this way, complexity of manufacturing a multi-layer 3D flash memory can be effectively reduced. In this case, the connection between the upper stack memory structure and the lower stack memory structure can be achieved by connecting the source/drain pillar of the upper stack memory structure with the source/drain pillar of the lower stack memory structure. Since the source/drain pillar in the stack memory structure of the present invention has a larger size compared to other components, the upper stack memory structure and the lower stack memory structure can be easily aligned, and thus mismatch is less likely to occur and the channel pillar of the upper stack memory structure and the channel pillar of the lower stack memory structure may therefore not be completely aligned.

Figure 4A:
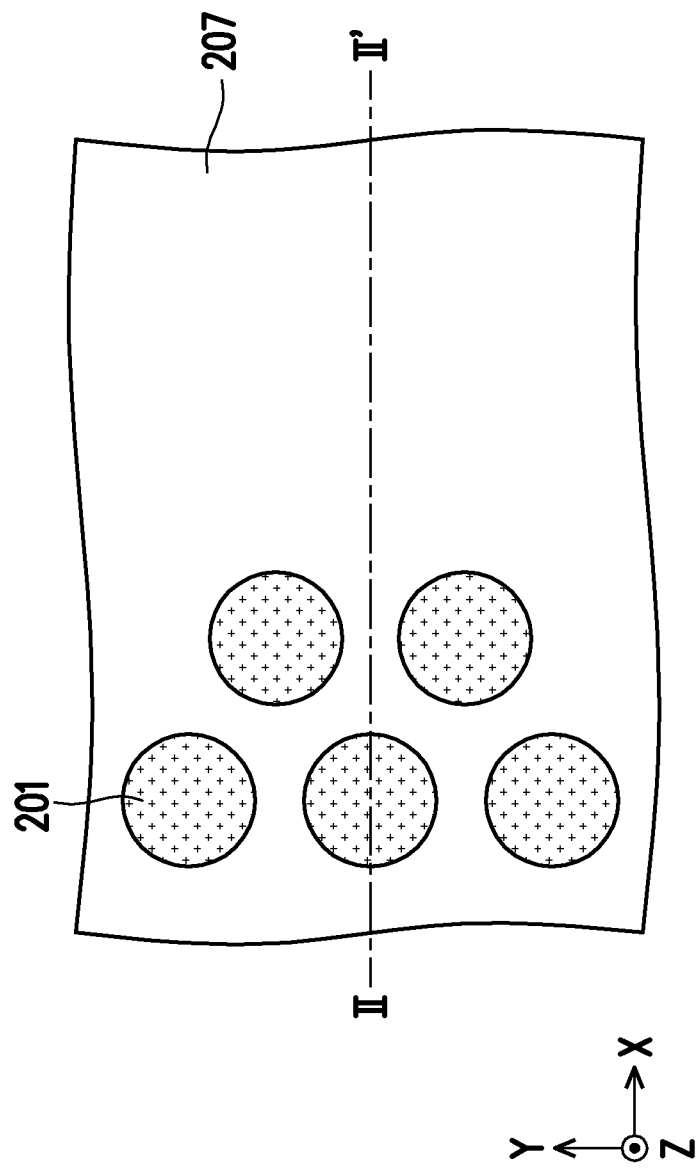
Figure 4C:
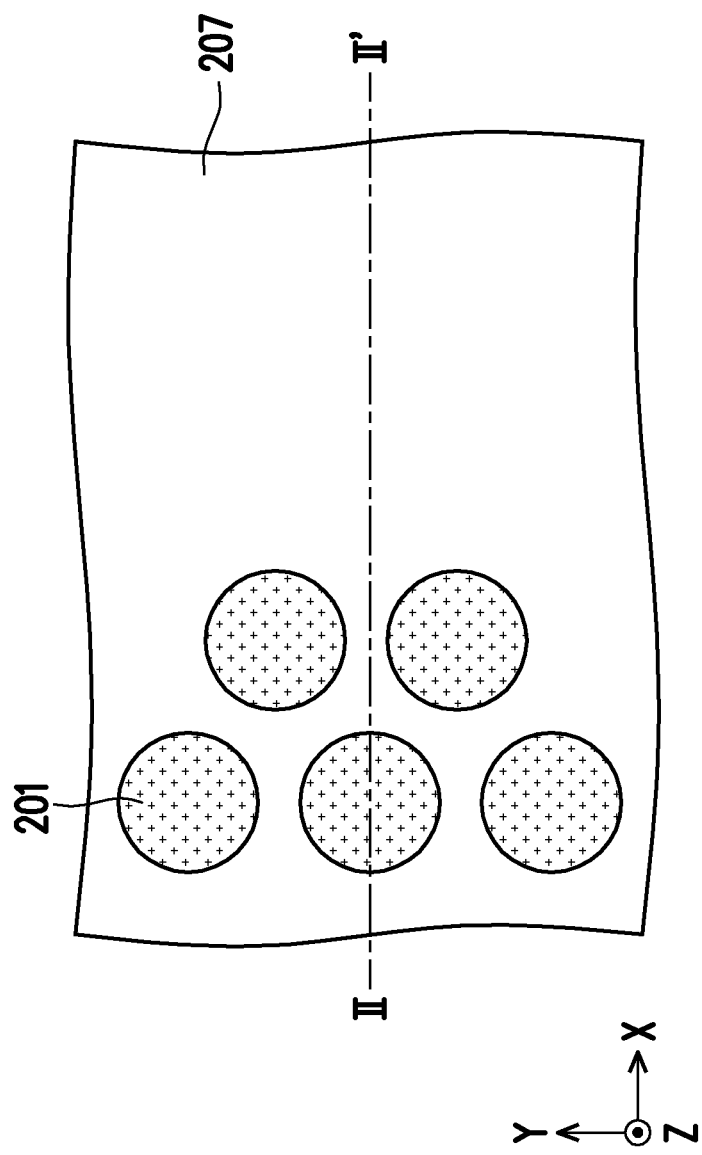
Figure 4D:
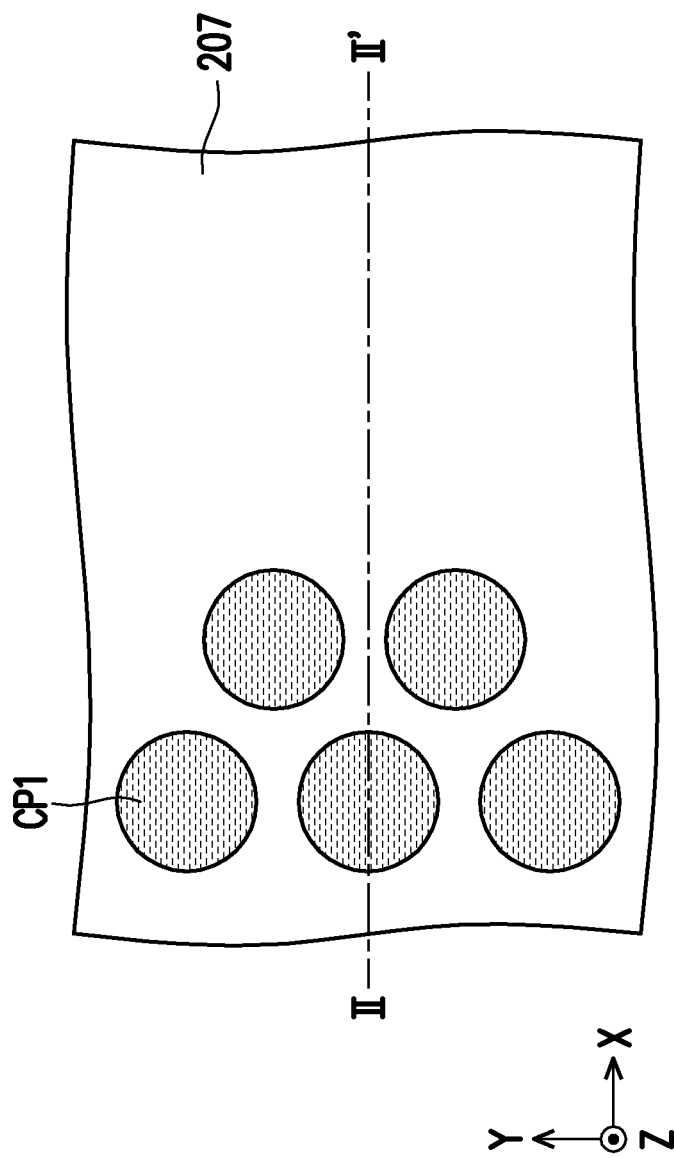
Figure 4E:
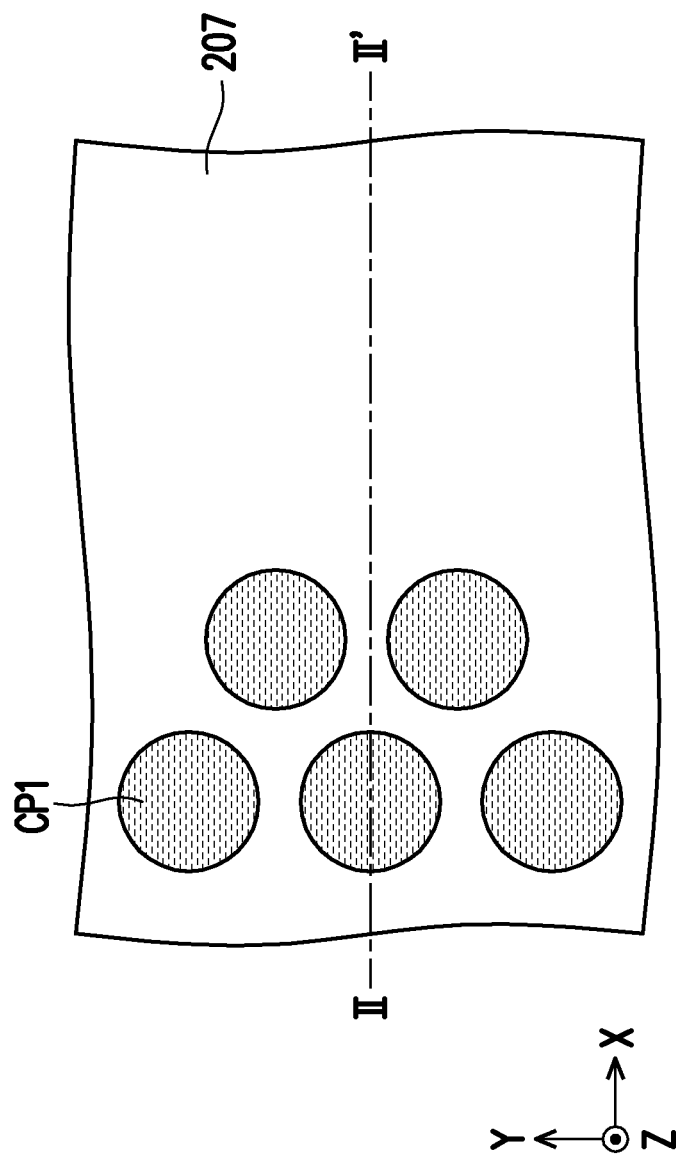
Figure 4F:
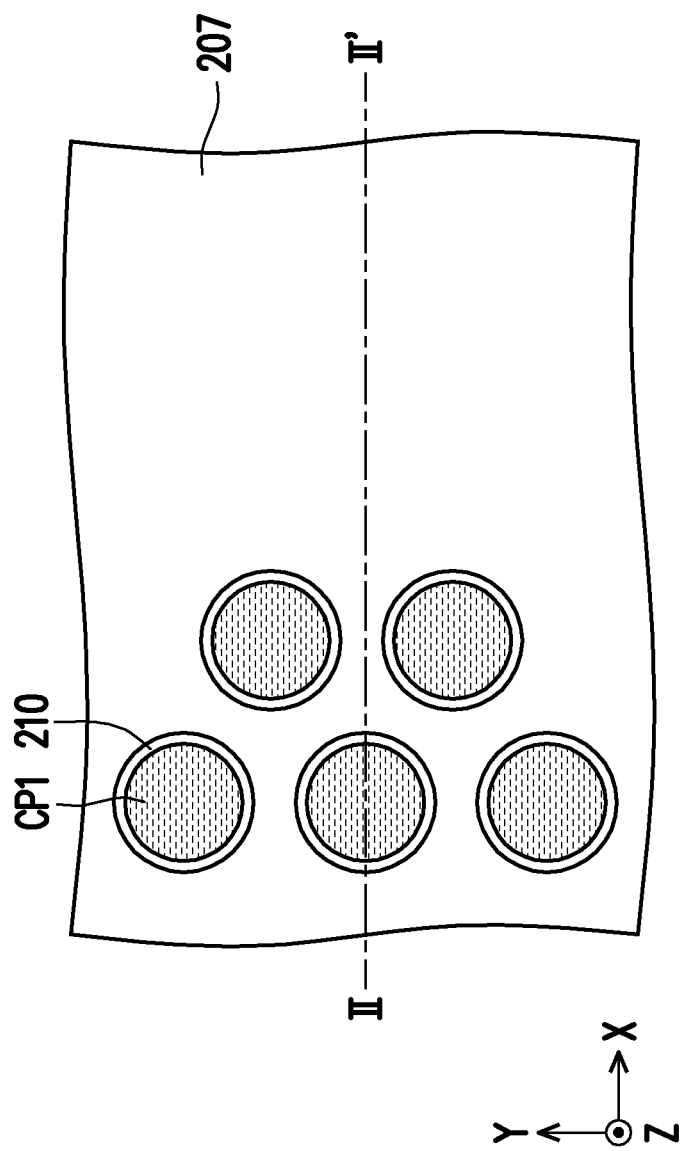
Figure 4G:
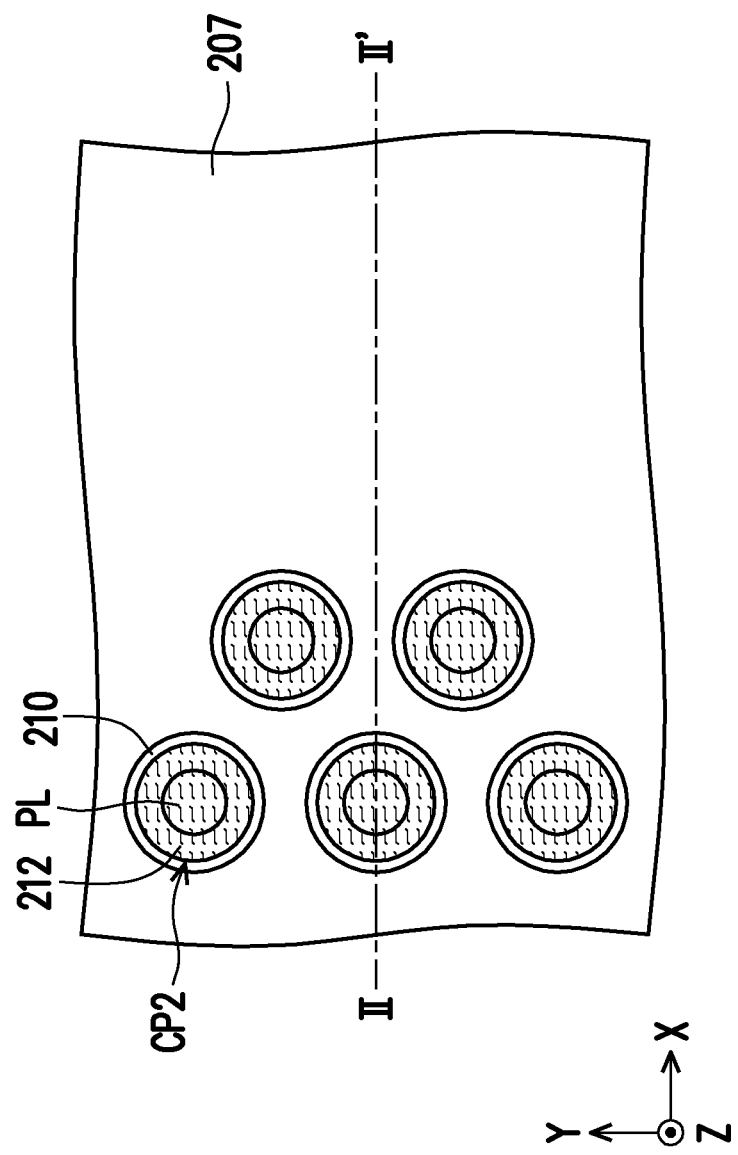
Figure 4H:
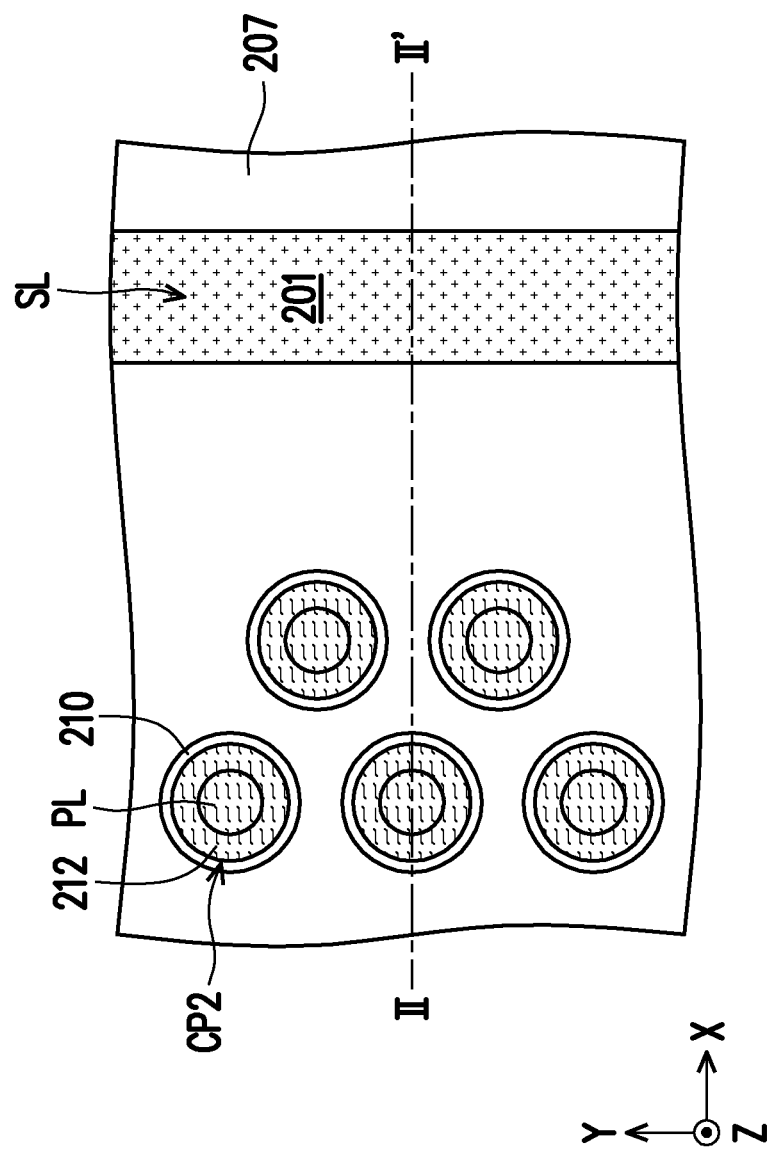
Figure 4I:
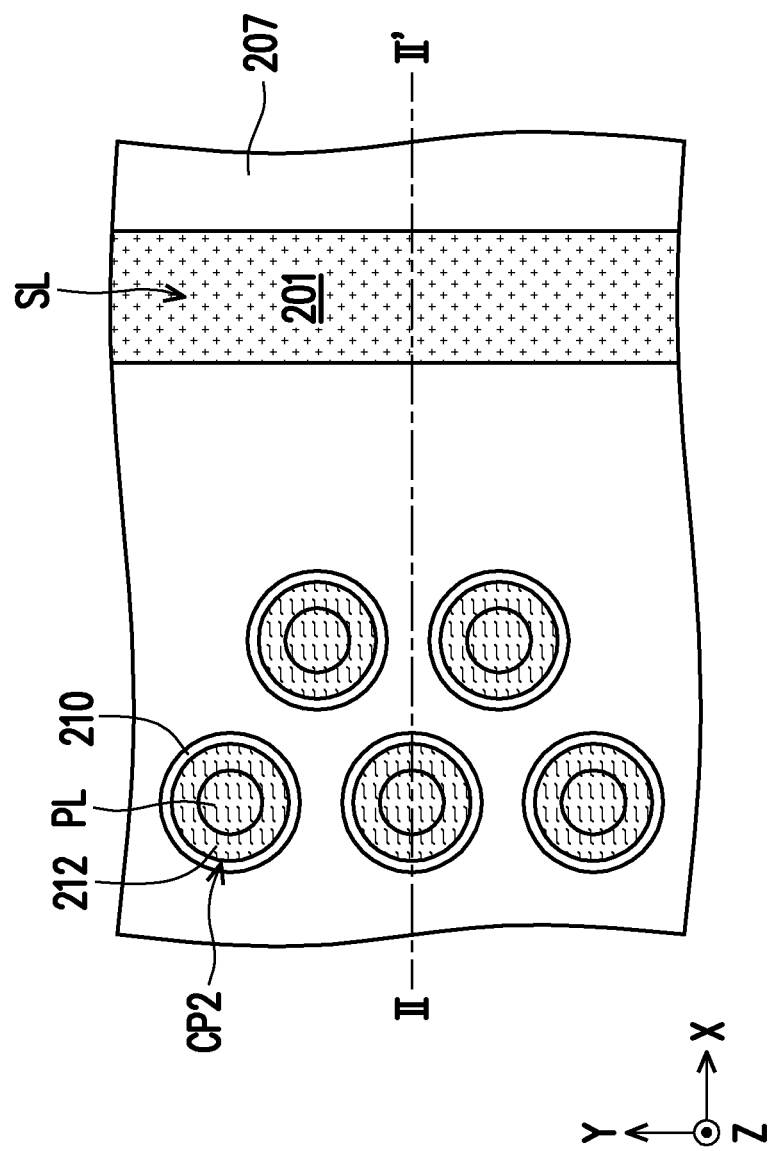
Figure 4J:
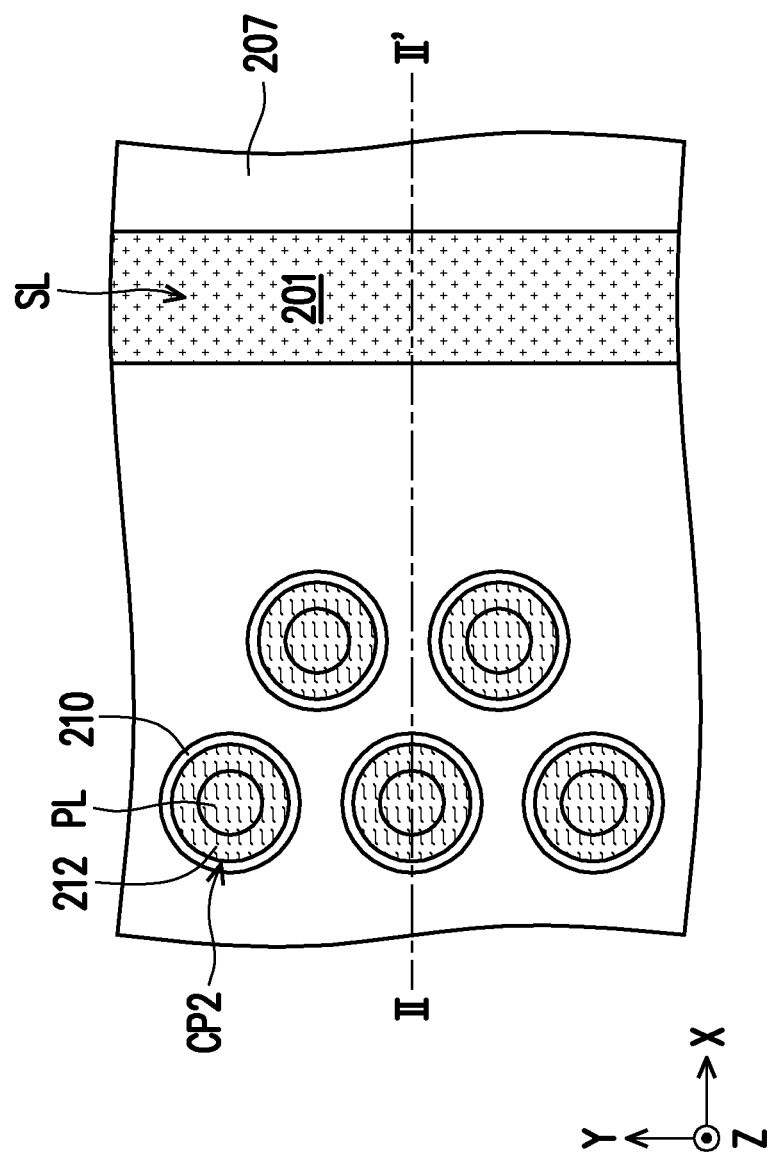
Figure 4K:
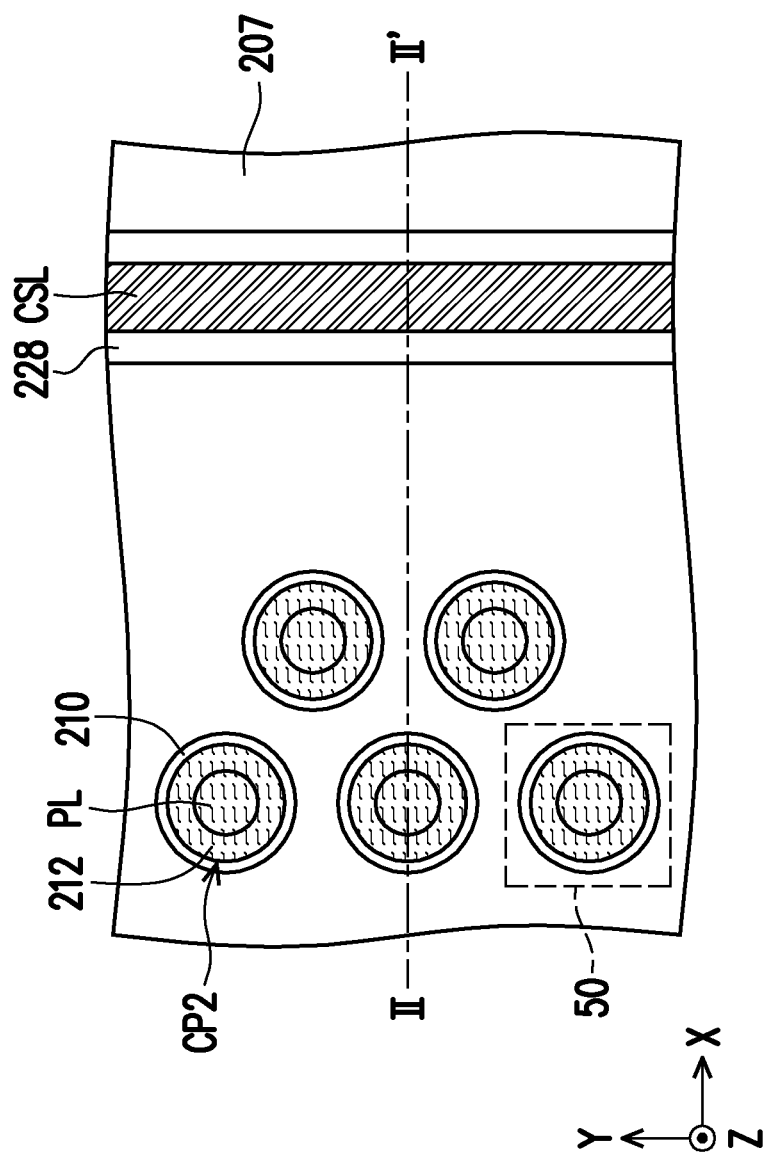

Referring FIG. 4K is a top view of a vertical two transistors (2T) flash memory according to the second embodiment of the present invention. FIG. 5K is a schematic cross-sectional view taken along line II-II' of FIG. 4K. FIG. 3 is an enlarged schematic view of the memory cell in the region B' of FIG. 5K and rotated by 90 degrees.

Referring to FIG. 4K, in the present embodiment, a vertical 2T flash memory includes a plurality of stacked memory structure 50. The stacked memory structure 50 may be arranged in an array. In FIG. 4K, the NOR flash memory has five stacked memory structure 50 arranged in an array. In the array, the odd-numbered stacked memory structures 50 are aligned with each other, the even-numbered stacked memory structures 50 are aligned with each other, and the stacked memory structure 50 of two adjacent columns are staggered with each other. In addition, the number, position, orientation, pitch, etc. of these stacked memory structure 50 are not limited to those shown in FIG. 4K.

Referring to FIGS. 4K and 5K, each stack memory structure 50 includes a gate stack structure SK2 provided on the substrate 200. The gate stack structure SK2 includes a gate layer 204 and a gate layer 250 insulated from each other. The gate layer 204 may be used as a selective gate, which is located between the substrate 200 and the gate layer 250, and is electrically insulated from the substrate 200 by the insulating layer 203, and electrically insulated from the gate layer 250 by the insulating layer 205.

Referring to FIGS. 3 and 5K, the gate layer 250 is located between the insulating layers 205 and 207, and includes a first gate portion 209, a ferroelectric portion 225, and a second gate portion 226. The first gate portion 209 may be used as a floating gate, and the second gate portion 226 may be used as a control gate. The ferroelectric portion 225 is sandwiched between the sidewall of the first gate portion 209 and the sidewall of the second gate portion 226, and forms a lateral sandwich structure therewith. The ferroelectric portion 225 further extends to cover and contact the top surface and bottom surface of the second gate portion 226 to form a vertical sandwich structure.

Referring to FIG. 5K, the stack memory structure 50 further includes a channel structure CP. The channel structure CP penetrates the gate stack structure SK2 and is electrically connected to the doped region 201 formed in the substrate 200. The channel structure CP includes channel plug CP1 and channel pillar CP2. The channel plug CP1 is disposed below the channel pillar CP2, and penetrates the insulating layer 205, the gate layer 204, and the insulating layer 203. The top surface of the channel plug CP1 is electrically connected to the bottom surface of the channel pillar CP2, and the bottom surface of the channel plug CP1 is electrically connected to the doped region 201 in the substrate 200. The channel pillar CP2 is located above the channel plug CP1, and is continuous in its extending direction. Further, the channel pillar CP2 penetrates the insulating layer 207, the gate layer 250, and the other part of the insulating layer 205. In some embodiments, the channel pillar CP2 includes a channel pillar 212, a filling layer GF, and a conductive plug PL. The sidewall of the channel pillar 212 is continuous in the extending direction thereof, and penetrates the insulating layer 207, the gate layer 250, and the other part of the insulating layer 205. The bottom surface of the channel pillar 212 is electrically connected to the top surface of the channel plug CP1. The filling layer GF is located in the channel pillar 212. The conductive plug PL is located above the filling layer GF, and the sidewall of the conductive plug PL is electrically connected to the sidewall of the channel pillar 212. In addition, the top surface of the conductive plug PL may be coplanar with the top surface of the channel pillar 212, the gate dielectric layer 210, and the insulating layer 207, but not limited thereto.

The stack memory structure 50 further includes a gate dielectric layer 211B and a gate dielectric layer 210. The gate dielectric layer 211B is disposed on the dielectric base 100, surrounds the outer sidewall of the channel plug CP1, and is between the channel plug CP1 and the gate layer 204. The gate dielectric layer 210 is disposed above the channel plug CP1 and surrounds the outer sidewall of the channel pillar CP2. The gate dielectric layer 210 is continuous in the extending direction thereof, and vertically penetrates the insulating layer 207, the gate layer 250, and the other part of the insulating layer 205. Moreover, the gate dielectric layer 210 is disposed between the first gate portion 209 and the channel pillar 212 and is in contact therewith, and is disposed between the insulating layer 207 and the channel pillar 212 and in contact therewith.

Referring to FIGS. 4K and 5K, the stack memory structure 50 further includes a common source line CSL, which penetrates the gate stack structure SK2 and is electrically connected to the doped region 201 in the substrate 200. The common source line CSL is electrically insulated from the gate stack structure SK2 by an insulating liner layer 228.

Referring to FIGS. 3 and 5K, according to the second embodiment of the present invention, in a memory cell 52 of the stack memory structure 50 (shown in FIG. 5K), the second gate portion 226 as the control gate, the ferroelectric portion 225, and the first gate portion 209 as the floating gate form a first capacitor MFM. The first gate portion 209 as the floating gate, the gate dielectric layer 210 and the channel pillar 212 form a second capacitor MIS. The first capacitor MFM and the second capacitor MIS are conned in series to form a capacitor MFMIS. The description of the first capacitor MFM and the second capacitor MIS may refer to the above description of the first embodiment.

The vertical 2T flash memory may be manufactured with reference to the methods shown in FIGS. 4A to 4K and 5A to 5K, as described in detail below.

Figure 5A:
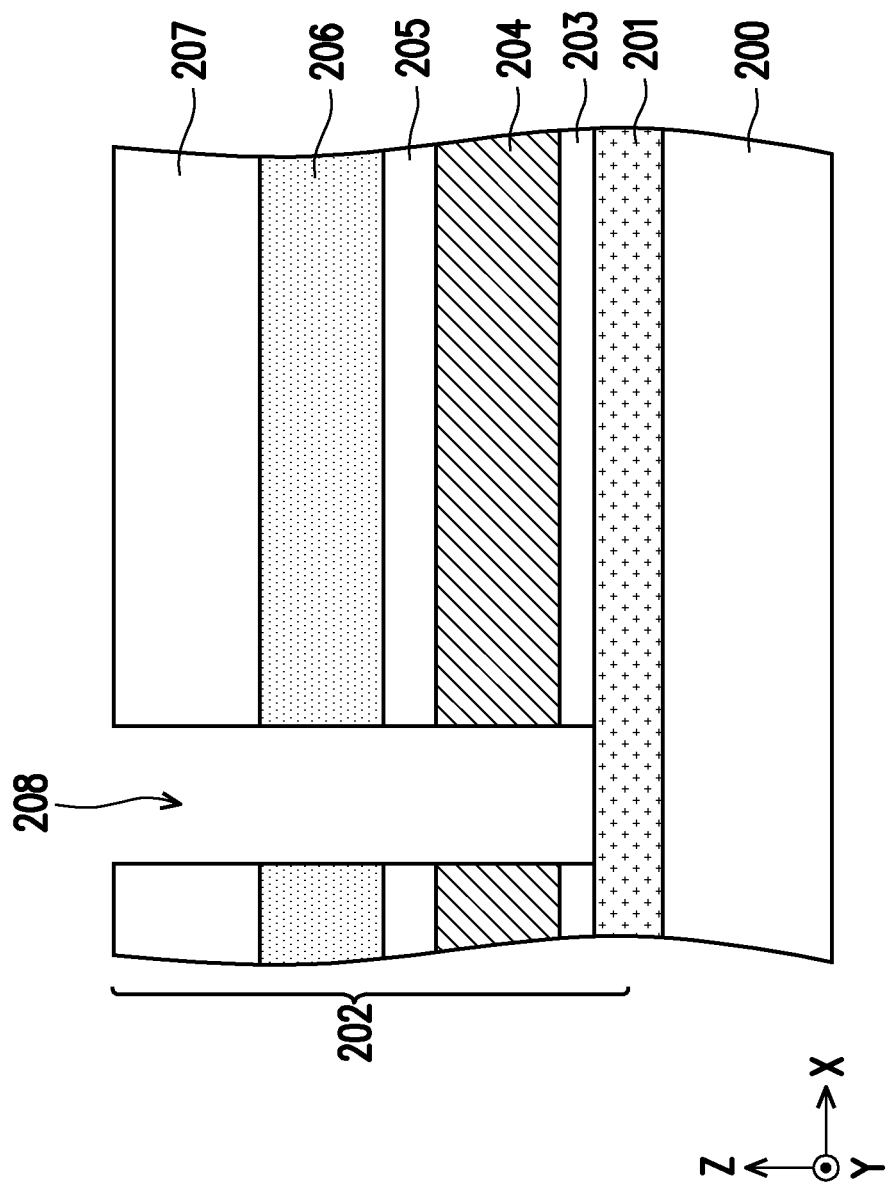
FIGS. 5A to 5K are schematic cross-sectional views taken along line II-II' in FIGS. 4A to 4K.
Figure 5B:
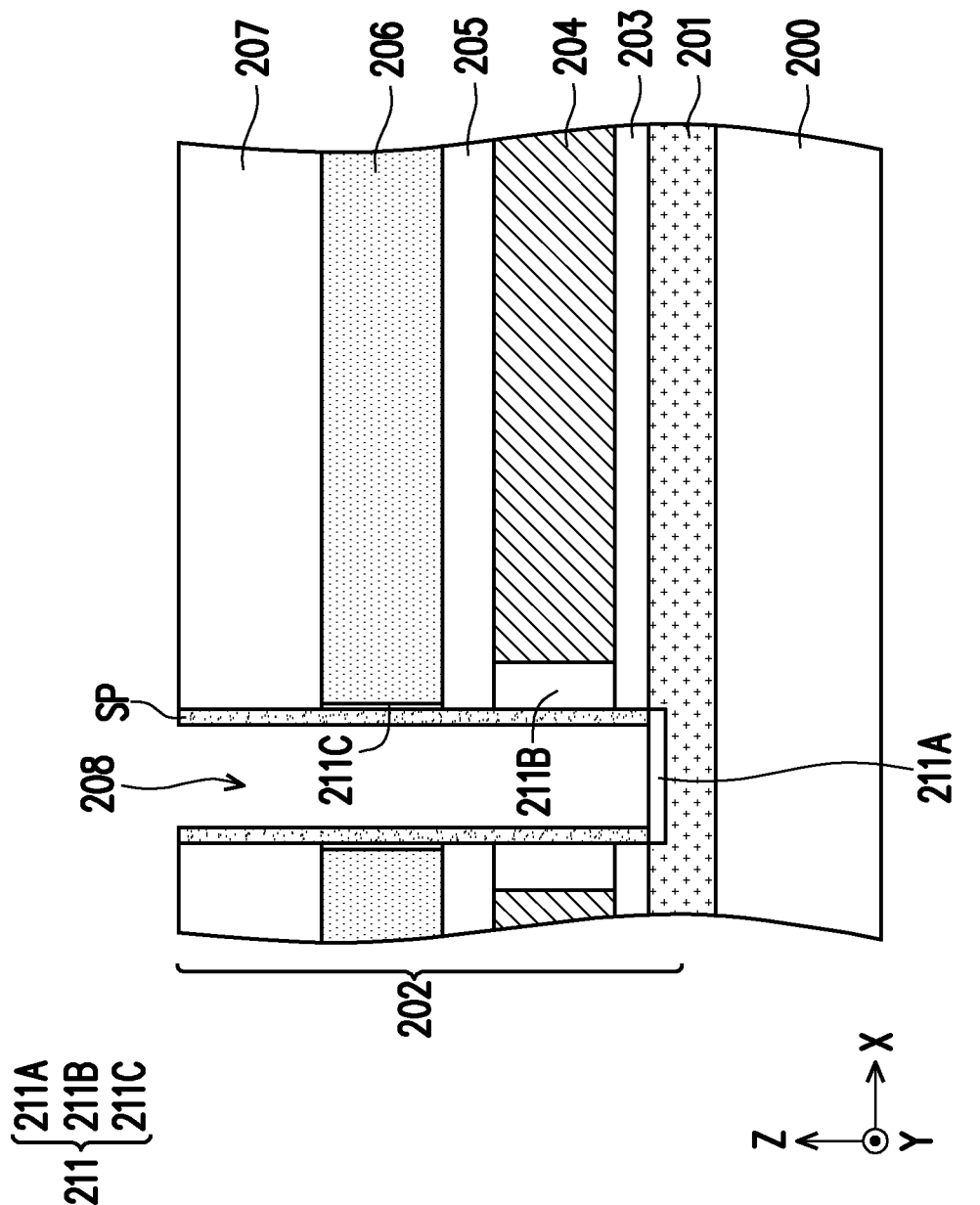

Referring to FIGS. 4A and 5A, a stack structure 202 is formed on a substrate 200. The substrate 200 may be a semiconductor substrate, such as a silicon substrate. In some embodiments, a doped region (for example, an N-doped region or an N-type well region) 201 may be formed in the substrate 200 according to design requirements. The stack structure 202 includes an insulating layer 203, a gate layer 204, an insulating layer 205, a sacrificial layer 206, and an insulating layer 207 that are sequentially stacked on the substrate 200. The insulating layers 203, 205, and 207 include silicon oxide. The gate layer 204 is, for example, a doped polysilicon layer. The sacrificial layer 206 is, for example, a silicon nitride layer. In some embodiments, the thickness t0 of the sacrificial layer 206 may range from 20 nm to 200 nm, for example, about 80 nm.

Next, an opening 208 is formed in the stack structure 202. In the present embodiment, the opening 208 extends along the Z direction, and the bottom of the opening 208 exposes the surface of the doped region 201 formed in the dielectric base 100, but the invention is not limited thereto. Alternatively, in other embodiments, the bottom of the opening 208 also extends into the doped region 201 in the dielectric base 100. In the present embodiment, from the top view, the opening 208 has a circular profile, but the present invention is not limited thereto. In other embodiments, the opening 208 may have a profile of other shapes, such as a polygon.

Figure 5C:
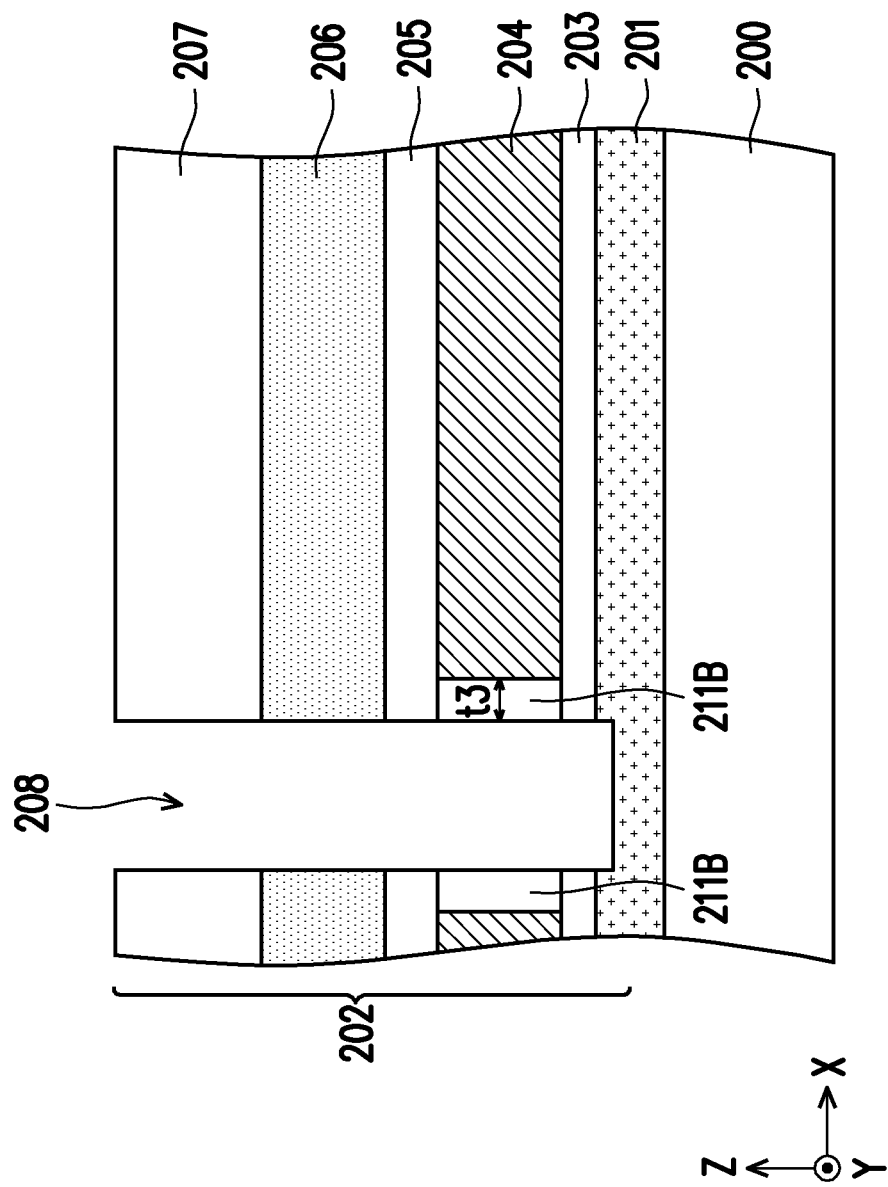

Referring to FIGS. 4C and 5C, a gate dielectric layer 211B is formed on the sidewall of the gate layer 204. The gate dielectric layer 211B may be silicon oxide or high-k dielectric material. The high-k dielectric material refers to a material with a dielectric constant greater than or equal to 4 or higher, such as silicon oxynitride or aluminum oxide. The gate dielectric layer 211B may be formed by the method described below.

Referring to FIGS. 4B and 5B, a thermal oxidation process is performed to oxidize the surfaces of the substrate 200 and the gate layer 204 exposed by the opening 208 to form an oxide layer 211. The oxide layer 211 includes oxide layers 211A and 211B. The oxide layer 211A is formed on the surface of the doped region 201 in the substrate 200. The oxide layer 211B is formed on the sidewall of the gate layer 204. The sidewall of the oxide layer 211B may be aligned with the sidewall of the insulating layer 203 and 205, or protruded from the sidewall of the insulating layers 203 and 205. In some embodiments, the oxide layer 211C is also formed on the sidewall of sacrificial layer 206, so the oxide layer 211C may be included in the oxide layer 211. Compared with the gate layer 204 and the substrate 200, the sacrificial layer 206 has a lower oxidation rate, so the thickness of the oxide layer 211C formed from the sacrificial layer 206 is thinner than the thickness of the oxide layers 211A or 211B formed from the gate layer 204 and the substrate 200.

After that, a spacer SP is formed on the sidewall of the opening 208. The material of the spacer SP is different from that of oxide layer 211C, and the spacer SP has a different etch rate from that of the oxide layer 211C in the subsequent etching process. The material of the spacer SP may be nitride, for example, silicon nitride. The spacer SP is formed by, for example, forming a spacer material layer on the top surface of the insulating layer 207 and on the sidewall and the bottom of the opening 208. Next, an anisotropic etching process is performed on the spacer material layer to remove the spacer material layer on the top surface of the insulating layer 207 and the bottom of the opening 208.

Referring to FIG. 4B, FIG. 4C, FIG. 5B, and FIG. 5C, by using the spacer SP as a mask, the oxide layer 211A on the surface of the substrate 200 is removed. Next, the spacer SP is removed, and then the oxide layer 211C is removed to expose the sidewall of the sacrificial layer 206. The oxide layer 211B left on the sidewall of the gate layer 204 serves as the gate dielectric layer 211B. The thickness t3 of the gate dielectric layer 211B is, for example, 5 nm to 30 nm.

Figure 5D:
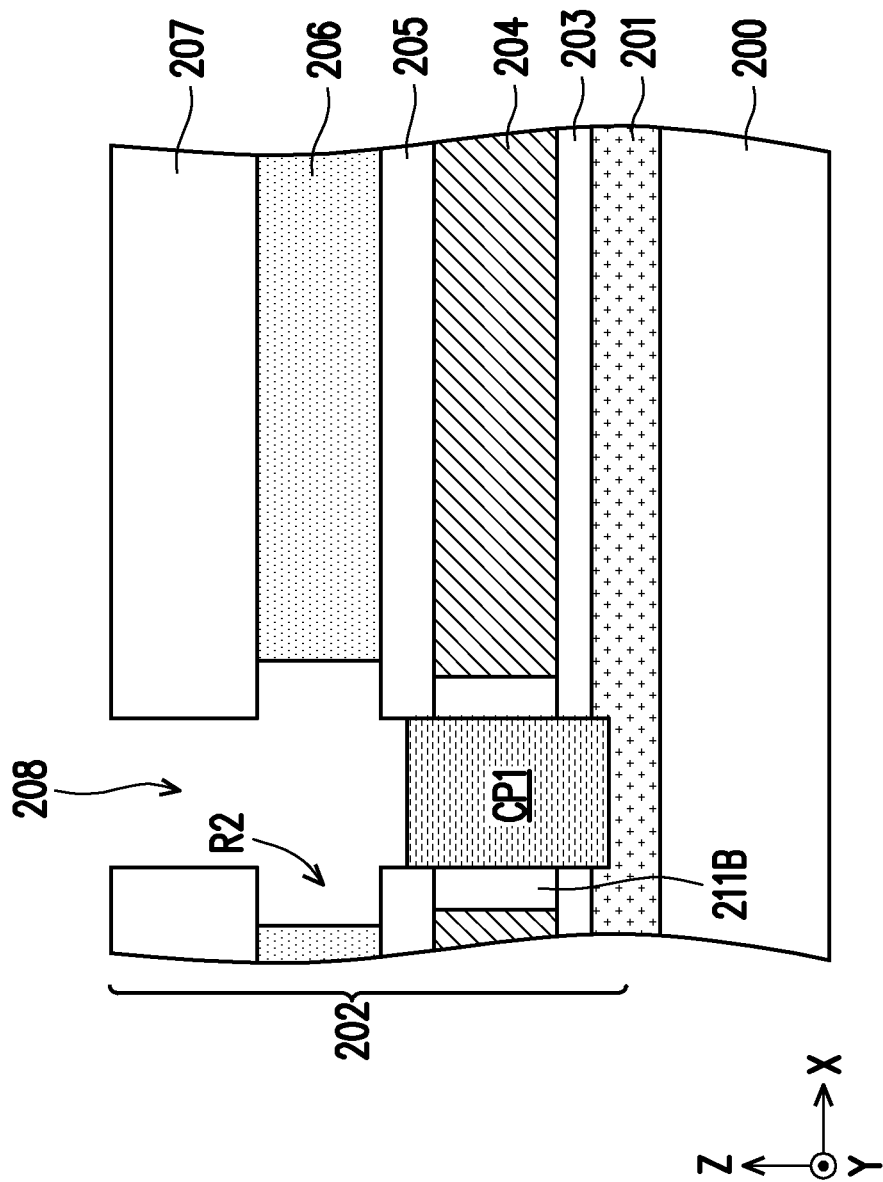

Referring to FIGS. 4D and 5D, a channel plug CP1 is formed in the opening 208. The channel plug CP1 is, for example, doped epitaxial silicon formed by a selective epitaxial growth process. The channel plug CP1 is electrically connected to the doped region 201 in the substrate 200. The height of the top surface of the channel plug CP1 is between the top surface and the bottom surface of the insulating layer 205, for example. Next, a pull-back process is performed to laterally etch the sacrificial layer 206 to form a recess R2 at the end of the sacrificial layer 206. The pull-back process may be an isotropic etching process, an anisotropic etching process, or a combination thereof.

Figure 5E:
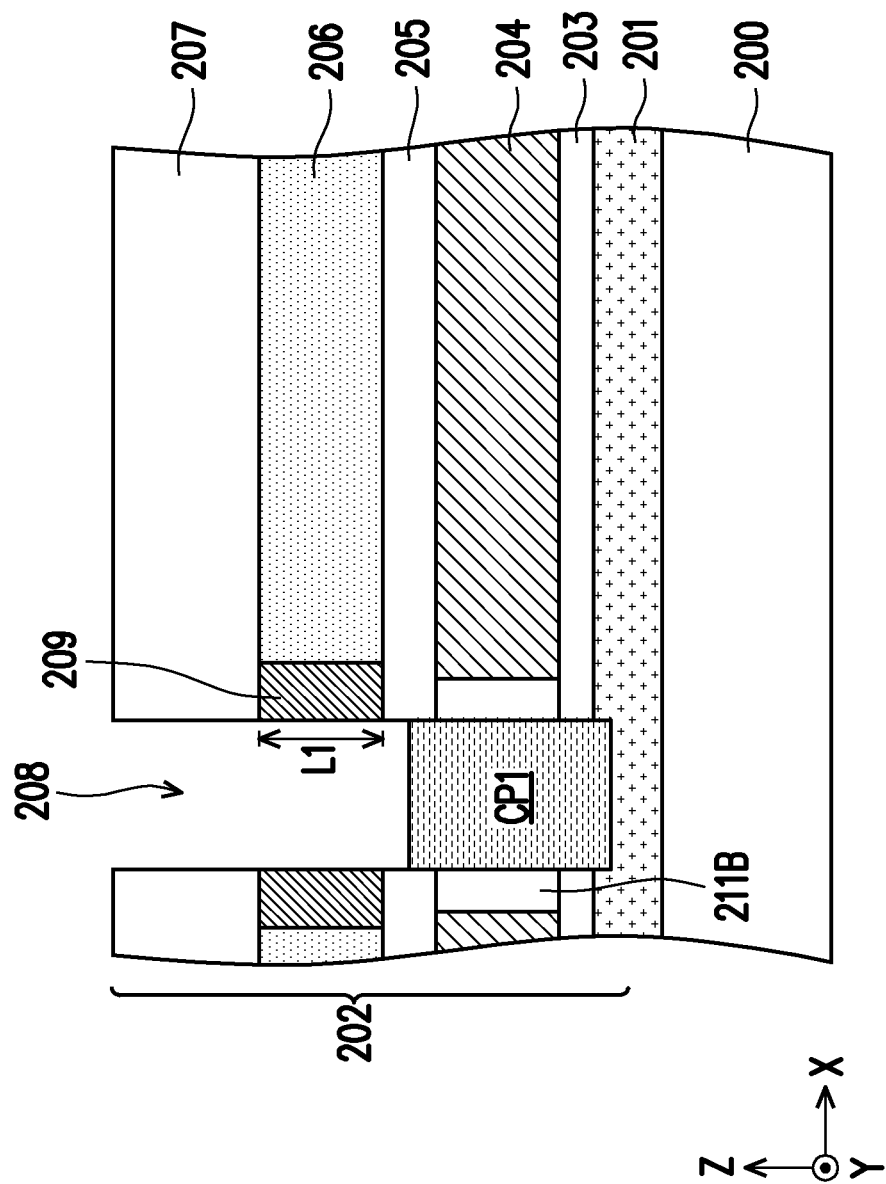

Referring to FIGS. 4E and 5E, a first gate portion 209 is formed in the recess R2. The first gate portion 209 may also be referred to as a floating gate layer. The first gate portion 209 is formed by, for example, forming a conductive layer to cover the top surface of the stack structure 202 and filling the opening 208 and the recess R2. The material of the conductive layer is, for example, polysilicon, amorphous silicon, tungsten (W), cobalt (Co), aluminum (Al), tungsten silicide ($WSi_x$), or cobalt silicide ($CoSi_x$). In addition, in other embodiments, before forming the first gate portion 209, a barrier layer (not shown) may be formed in the recess R2. The material of the barrier layer is, for example, titanium (Ti), titanium nitride (TiN), tantalum (Ta), tantalum nitride (TaN), or a combination thereof. After that, a pull-back process, such as an anisotropic etching process, is performed to remove the barrier layer and the conductive layer other than the recess R2, so that the top surface of the stack structure 202 and the sidewalls of the insulating layers 205 and 207 in the opening 208, and the top surface of the channel plug CP1 are exposed. Since the first gate portion 209 is formed in the recess R2, and the height of the recess R2 is approximately equal to the thickness to of the sacrificial layer 206, the thickness L1 of the first gate portion 209 may be adjusted by changing the thickness t0 of the sacrificial layer 206.

Figure 5F:
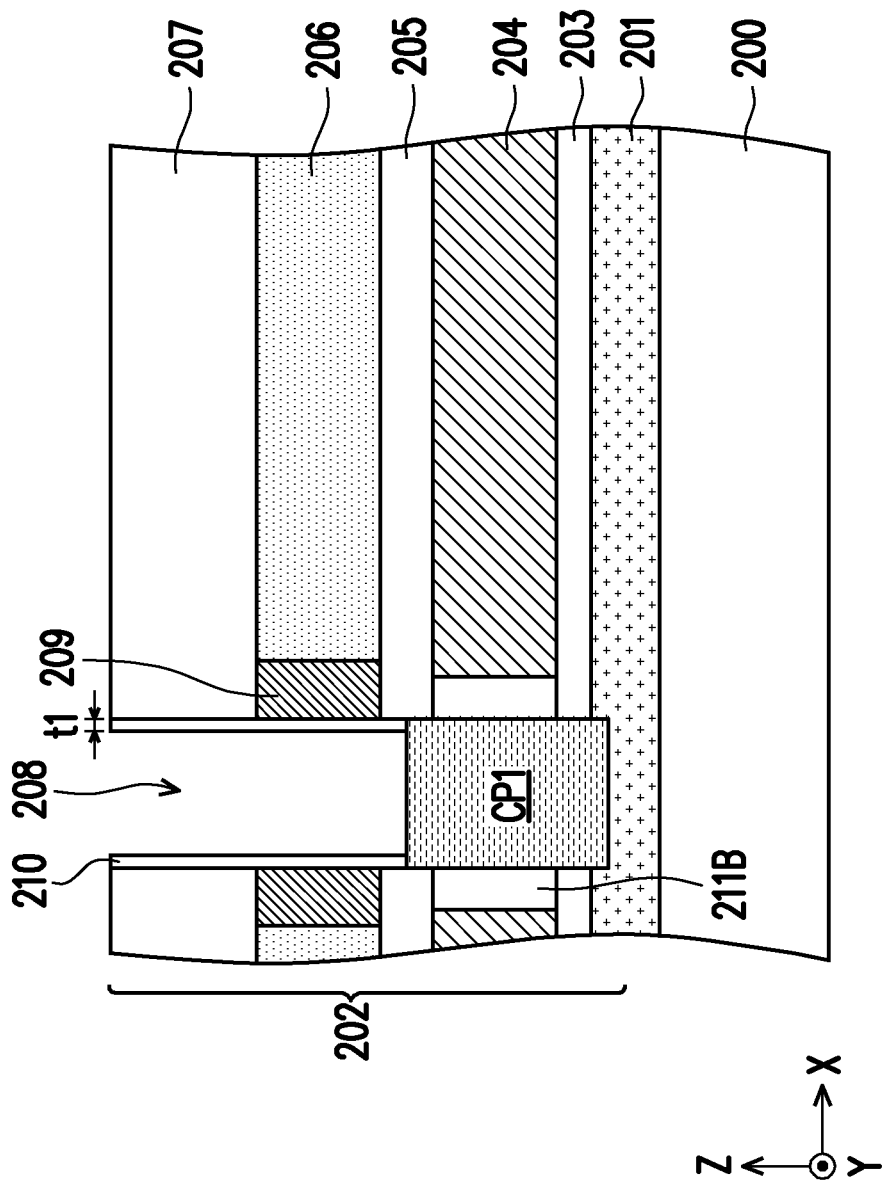

Referring to FIGS. 4F and 5F, a gate dielectric layer 210 is formed on the inner surface of the opening 208. The gate dielectric layer 210 is formed by, for example, forming a gate dielectric material layer to cover the top surface of the stack structure 202 and filling the opening 208 to cover the insulating layer 207, the first gate portion 209, and the insulating layer 205. The material of the gate dielectric material layer is, for example, silicon oxide or a high-k dielectric material, such as silicon oxynitride aluminum oxide, or a combination thereof. After that, an anisotropic etching process is performed to remove the excess gate dielectric material layer, so that the top surface of the stack structure 202 and the top surface of the channel plug CP1 are exposed.

Figure 5G:
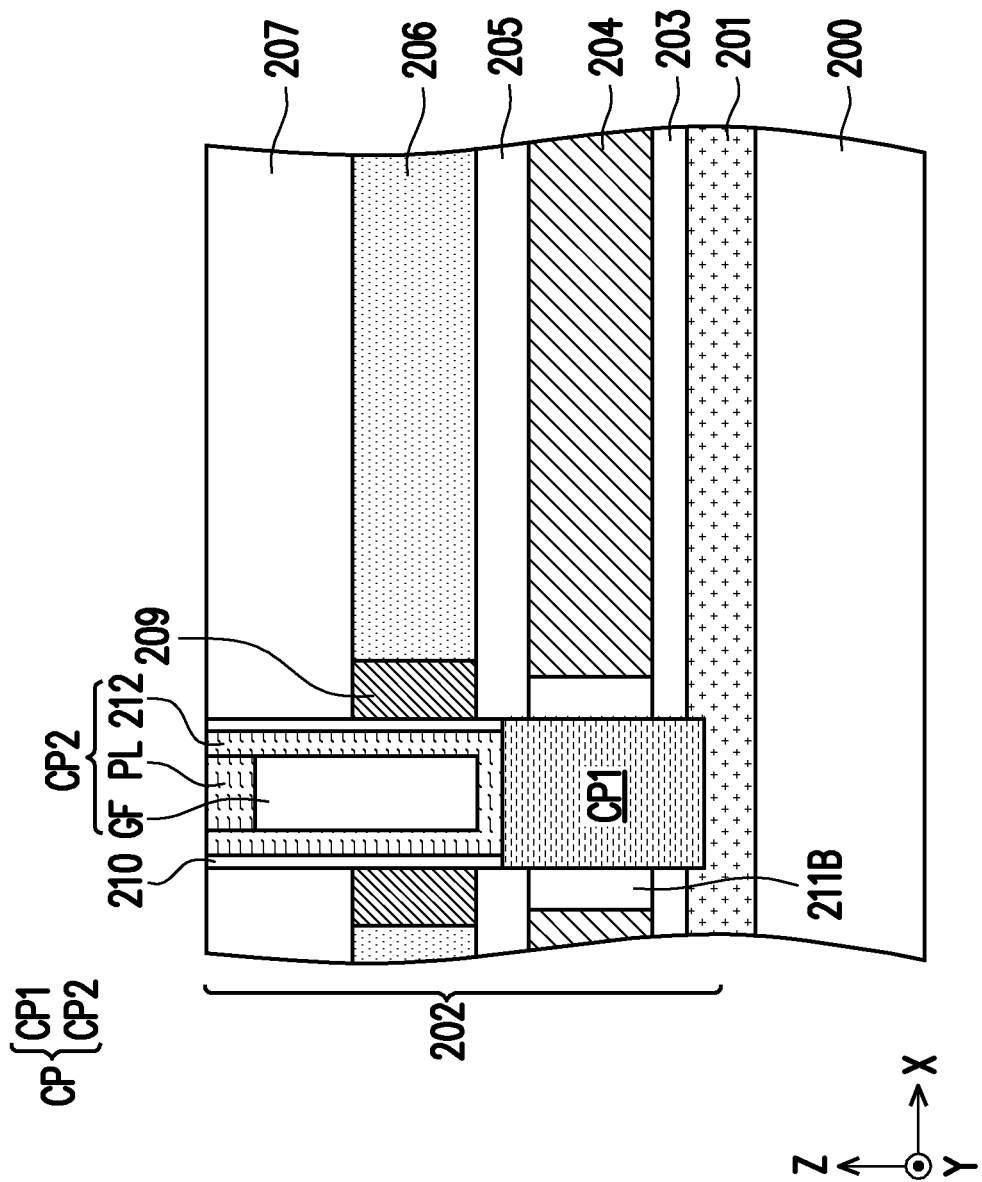

Referring to FIG. 4G and FIG. 5G, a channel pillar CP2 is formed in the opening 208. The channel pillar CP2 includes a channel pillar 212, a filling layer GF, and a conductive plug PL. The channel pillar 212 is, for example, an undoped polysilicon layer. The filling layer GF includes an insulating material, for example, silicon oxide. The conductive plug PL is, for example, doped polysilicon. The formation method of the channel pillar 212, the filling layer GF and the conductive plug PL is, for example, to form a sequential channel material layer and a filling material layer on the top surface of the insulating layer 207, the inner surface of the opening 208, and the top surface of the conductive plug PL. Then a chemical mechanical polishing process is performed to remove the filling material layer and the channel material layer on the top surface of the insulating layer 207. After that, an anisotropic etching process is performed on the filling material layer so that the top surface of the remaining filling layer GF is lower than the top surface of the channel pillar 212 to form a recess (not shown) on the filling layer GF. Afterwards, a conductive material layer is deposited to cover the top surface of the insulating layer 207 and fill the recess on the filling layer GF. Then, a chemical mechanical polishing process is performed to remove the conductive material layer on the top surface of the insulating layer 207 to form a conductive plug PL.

Figure 5H:
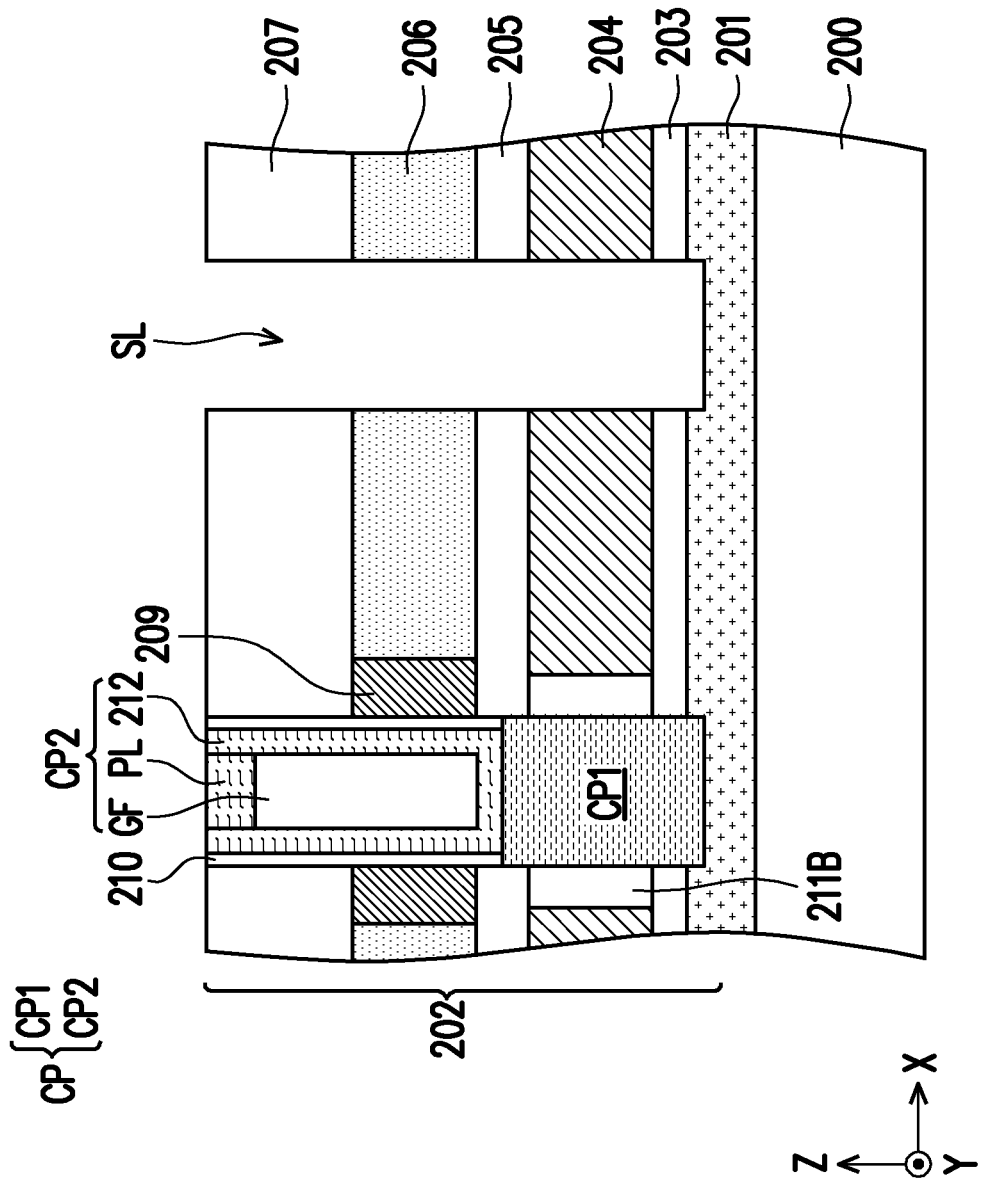

Referring to FIGS. 4H and 5H, a lithography and etching process is performed to form a slit opening SL in the stack structure 202. The slit opening SL has a long shape, which continuously extends in the Y direction. The sidewall of the slit opening SL exposes the insulating layer 207, the sacrificial layer 206, the insulating layer 205, the gate layer 204, and the insulating layer 203, and the bottom surface of the slit opening SL exposes the doped region 201 in the substrate 200.

Figure 5I:
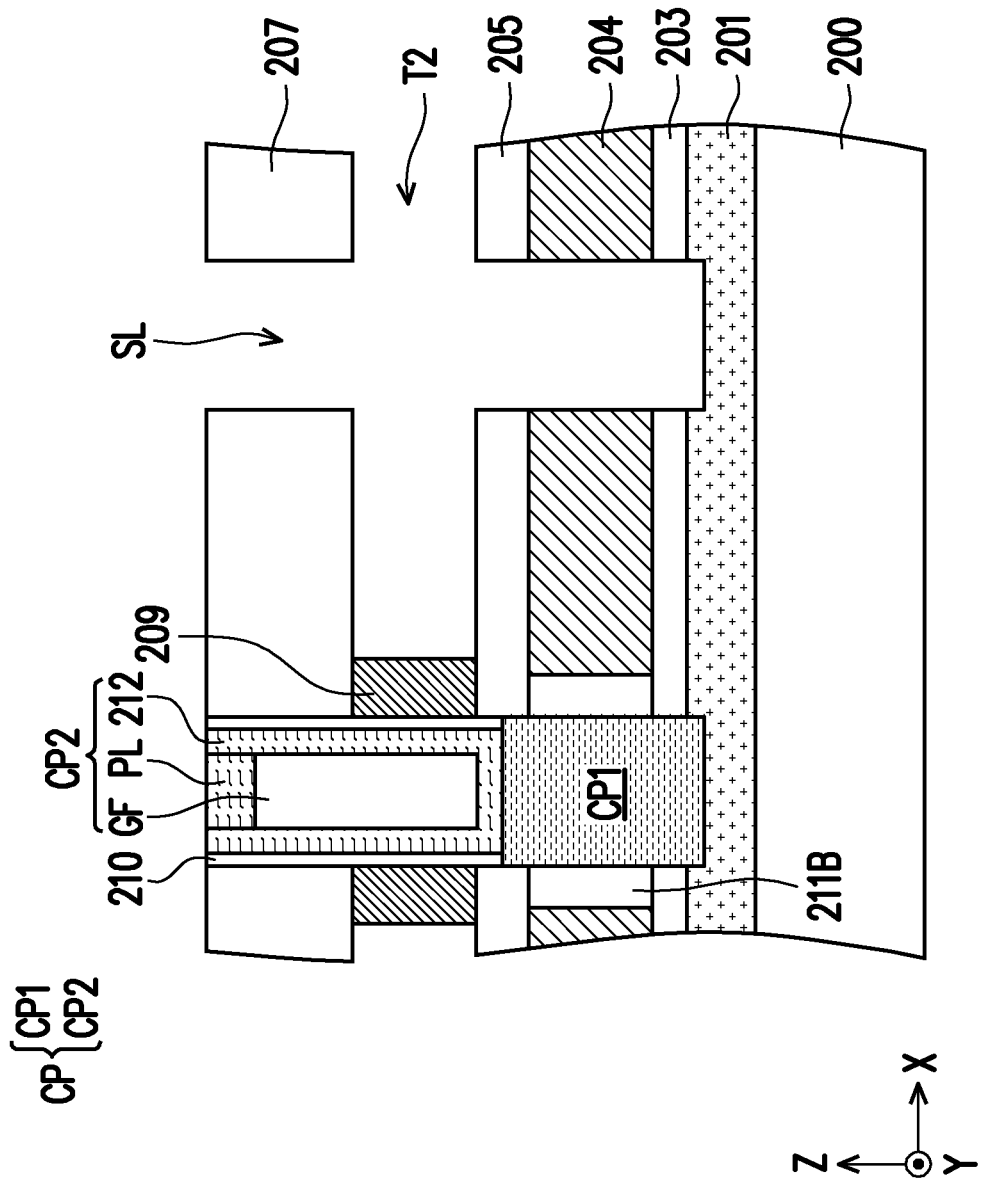

Referring to FIG. 5I, an isotropic etching process is performed, and the sacrificial layer 206 in the stack structure 202 is removed by an etchant through the slit opening SL so as to form a lateral opening T2 that exposes the insulating layers 205 and 207, and the first gate portion 209. The method of removing the sacrificial layer 206 includes an selective etching process.

Figure 5J:
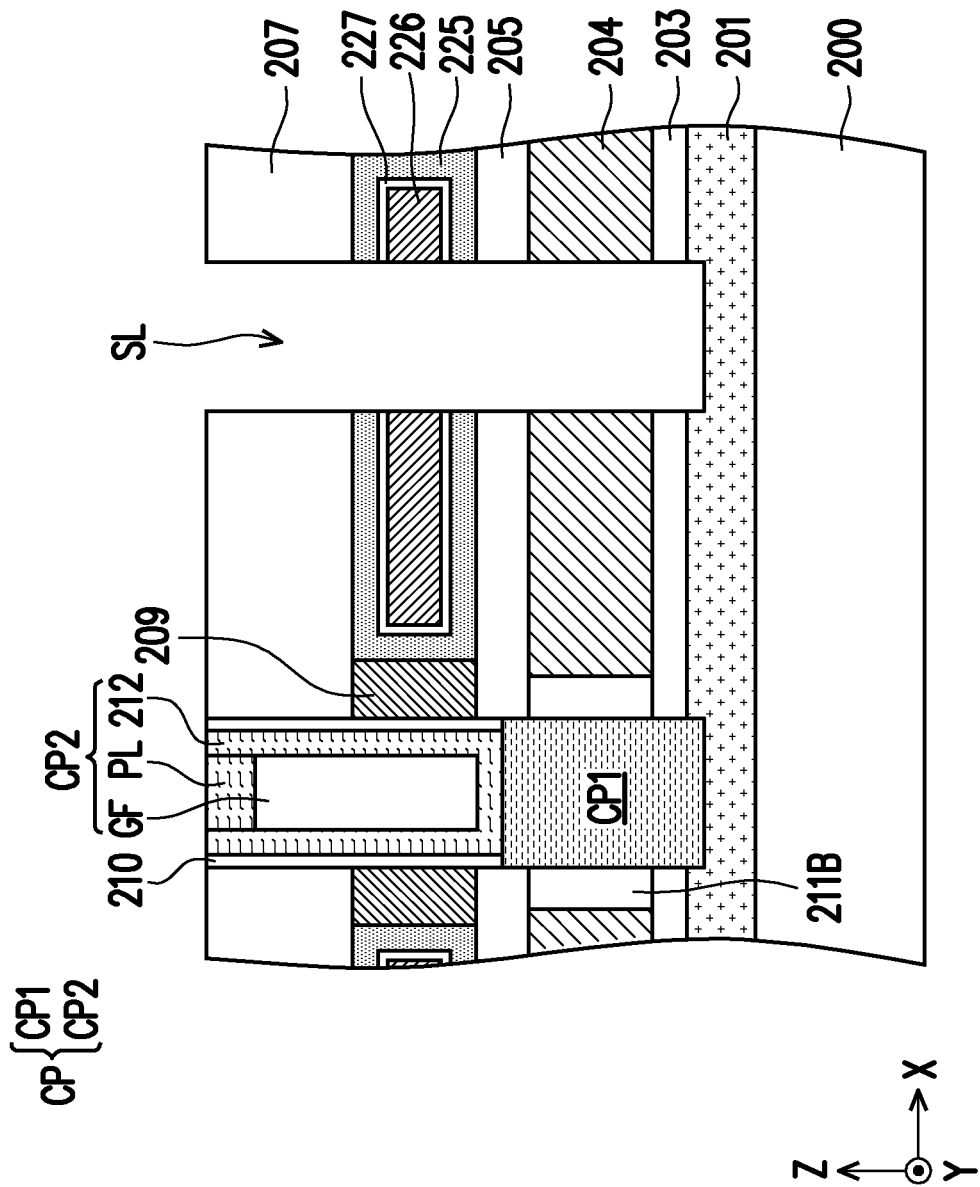
Figure 5K:
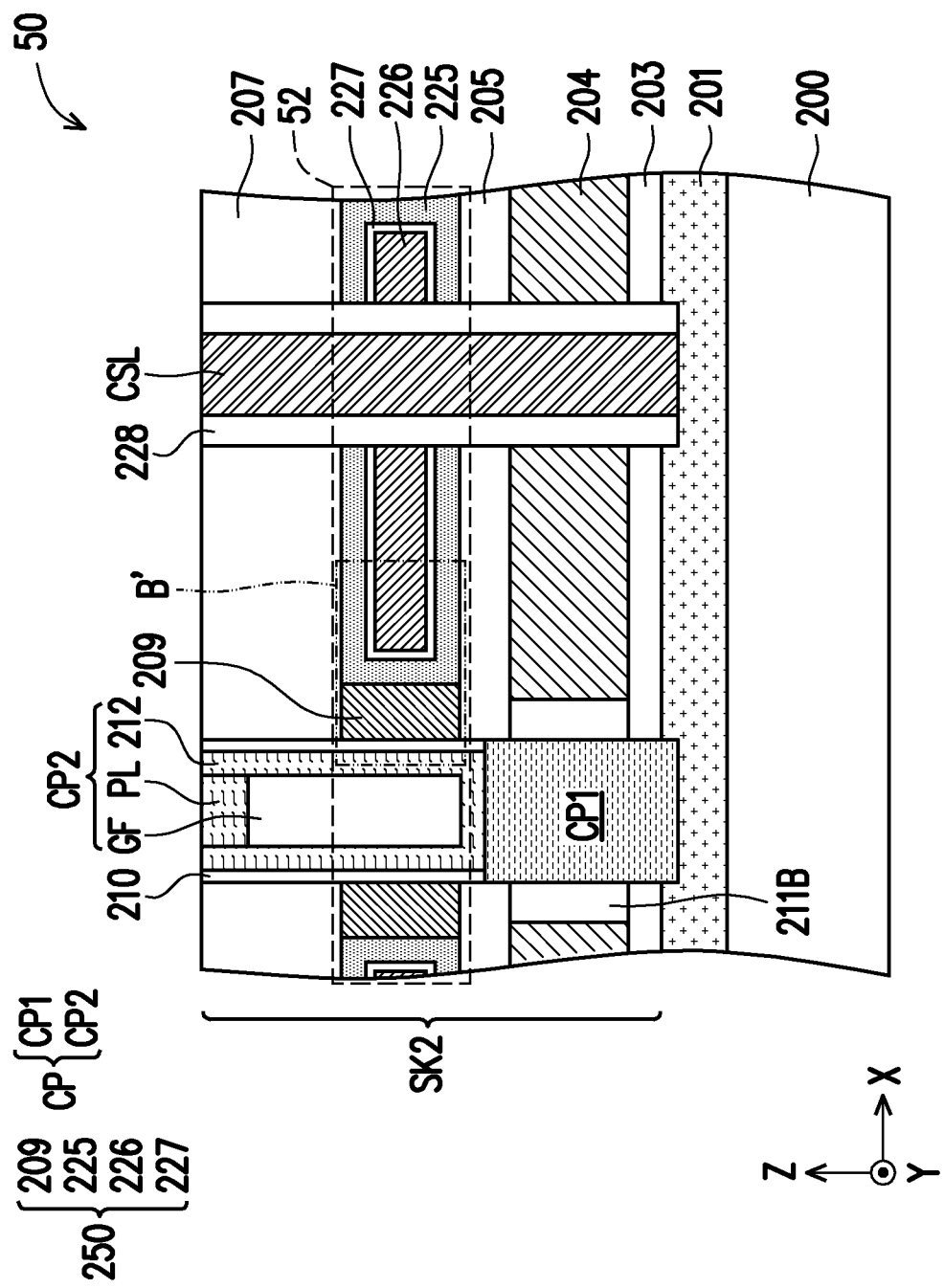

Referring to FIGS. 4J and 5J, after removing the sacrificial layer 206, the ferroelectric portion 225 and the second gate portion 226 are formed in the lateral opening T2. The second gate portion 226 may also be referred to as a control gate layer. The dielectric constant of the ferroelectric portion 225 is equal to or greater than the dielectric constant of the gate dielectric layer 210. In some embodiments, the dielectric constant ratio of the dielectric constant of the ferroelectric portion 225 to the dielectric constant of the gate dielectric layer 210 is between 1 to 7. The material of the ferroelectric portion 225 is, for example, hafnium oxide ($HfO_2$) doped with Al, Si, Zr, La, Gd, Y, or a combination thereof. The material of the second gate portion 226 is, for example, polysilicon, amorphous silicon, tungsten (W), cobalt (Co), aluminum (Al), tungsten silicide ($WSi_x$), or cobalt silicide ($CoSi_x$). In some embodiments, a barrier layer 227 is also included between the ferroelectric portion 225 and the second gate portion 226. The material of the barrier layer 227 is, for example, titanium (Ti), titanium nitride (TiN), tantalum (Ta), tantalum nitride (TaN), or a combination thereof.

The formation methods of the ferroelectric portion 225, barrier layer 227, and second gate portion 226 are as follows. A ferroelectric material layer is formed in the lateral opening T2 and the slit opening SL. The formation method of the ferroelectric material layer is, for example, CVD. The ferroelectric material layer does not fill up the lateral opening T2. After forming the ferroelectric material layer, a barrier layer and a gate material layer are formed on the ferroelectric material layer and in the remaining space of the lateral opening T2. Afterwards, an etch back process is performed to remove the ferroelectric material layer, barrier layer and gate material layer other than the lateral opening T2 so as to form the ferroelectric portion 225, the barrier layer 227 and the second gate portion 226.

Referring to FIGS. 4K and 5K, an insulating liner layer 228 and a common source line CSL are formed in the slit opening SL. The insulating liner layer 228 is formed by, for example, forming an insulating material layer on the top surface of the insulating layer 207 and in the slit opening SL. Then, an anisotropic etching process is performed to remove the insulating material layer on the top surface of the insulating layer 207 and the bottom surface of the slit opening SL, thereby forming the insulating liner layer 228 that exposes the bottom surface of the slit opening SL. The common source line CSL is formed by, for example, forming a conductive material layer on the top surface of the insulating layer 207 and the remaining space of the slit opening SL, and then performing an anisotropic etching process to remove the conductive material layer on the top surface of the insulating layer 207 so as to form the common source line CSL.

Thereafter, the metallization process and other subsequent processes may be performed. For example, the subsequent metallization process may form a bit line electrically connected to the conductive plug PL to complete the vertical 2T flash memory.

The flash memory of the embodiment of the present invention design the coupling area of the first capacitor (MFM) formed by the control gate layer, the ferroelectric portion and the floating gate layer to be smaller than the coupling area of the second capacitor (MIS) formed by the floating gate layer, the gate dielectric layer and the channel layer. In this way, a large voltage across the first capacitor to reduce the electric field across the second capacitor, so that the effect of tunnel injection caused by excessive electric field across the gate dielectric layer may be avoided, and the problem of capacitance mismatch between the first capacitor and second capacitor capacitance caused by excessive difference in the dielectric constant between the gate dielectric layer and the ferroelectric portion can be improved. Therefore, the embodiment of the present invention can not only improve the efficiency of reading and writing, improve the reliability of flash memory, but also have a larger memory window.

In addition, in the flash memory fabricating method of the embodiment of the present invention, the design of the thickness of the gate dielectric layer, the floating gate, the control gate layer and ferroelectric portion may be used to easily adjust the ratio of the coupling area of the first capacitor to the coupling area of the second capacitor.

In addition, the 3D flash memory of the present invention has high integration and high area utilization, and meets the requirement of fast operation speed.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A flash memory, comprising:
   a gate stack structure disposed on a dielectric base and includes a plurality of gate layers electrically insulated from each other, each gate layer comprising:
      a first gate portion;
      a second gate portion disposed adjacent to a sidewall of the first gate portion, wherein a thickness of the second gate portion is smaller than a thickness of the first gate portion;
      a ferroelectric portion disposed between the sidewall of the first gate portion and a sidewall of the second gate portion; and
   a channel pillar arranged on the dielectric base and penetrating the gate stack structure;
   a first conductive pillar, and a second conductive pillar connected to the channel pillar and penetrating the gate stack structure, wherein the first conductive pillar and the second conductive pillar are separated from each other; and
   a gate dielectric layer disposed between another sidewall of the first gate portion and a sidewall of the channel pillar.

2. The flash memory of claim 1, wherein the second gate portion, the ferroelectric portion and the first gate portion has a first coupling area smaller than a second coupling area of the first gate portion, the gate dielectric portion and the channel pillar.

3. The flash memory of claim 2, wherein a ratio of the first coupling area to the second coupling area is between 0.2 and 0.5.

4. The flash memory of claim 1, wherein the ferroelectric portion has a dielectric constant greater than or equal to a dielectric constant of the gate dielectric layer.

5. The flash memory of claim 1, wherein the ferroelectric portion is a conformal layer.

6. The flash memory of claim 1, wherein the ferroelectric portion covers a top surface and a bottom surface of the second gate portion.

7. The flash memory of claim 1, further comprising a barrier layer located between the ferroelectric portion and the second gate portion.

8. A flash memory, comprising:
   a gate stack structure disposed on a substrate, comprising:
      a first gate layer, comprising:
         a first gate portion;
         a second gate portion disposed adjacent to a sidewall of the first gate portion, wherein a thickness of the second gate portion is smaller than a thickness of the first gate portion; and
         a ferroelectric portion disposed between the sidewall of the first gate portion and a sidewall of the second gate portion; and
      a second gate layer located between the first gate layer and the substrate, and electrically insulated from the substrate and the first gate layer;
   a channel structure penetrating the gate stack structure and electrically connected to the substrate;
   a first gate dielectric layer disposed between a sidewall of the channel structure and another sidewall of the first gate portion; and
   a second gate dielectric layer disposed between the sidewall of the channel structure and a sidewall of the second gate layer.

9. The flash memory of claim 8, wherein the second gate portion, the ferroelectric portion and the first gate portion have a first coupling area smaller than a second coupling area of the first gate portion, the first gate dielectric layer and the channel structure.

10. The flash memory of claim 9, wherein a ratio of the first coupling area to the second coupling area is between 0.2 and 0.5.

11. The flash memory of claim 8, wherein the ferroelectric portion has a dielectric constant greater than or equal to a dielectric constant of the first gate dielectric layer.

12. The flash memory of claim 8, wherein the ferroelectric portion is a conformal layer.

13. The flash memory of claim 8, further comprising:
a common source line penetrating the gate stack structure, and electrically connected to the substrate.

14. The flash memory of claim 13, further comprising:
an insulating liner layer located between the gate stack structure and the common source line.

15. The flash memory of claim 8, wherein the channel structure comprises: a channel pillar penetrating the first gate layer, wherein an outer sidewall of the channel pillar is surrounded by the first gate dielectric layer; and a channel plug arranged under the channel pillar and penetrating the second gate layer, wherein a sidewall of the channel plug is surrounded by the second gate dielectric layer, a top surface of the channel plug is electrically connected to a bottom surface of the channel pillar, a bottom surface of the channel plug is electrically connected to the substrate.

16. The flash memory of claim 8, further comprising a barrier layer located between the ferroelectric portion and the second gate portion.

17. The flash memory of claim 8, wherein the ferroelectric portion covers a top surface and a bottom surface of the second gate portion.

18. A method of fabricating flash memory, comprising:
forming an insulating stack structure on the dielectric base, the insulating stack structure comprising a plurality of insulating layers and a plurality of sacrificial layers alternately with each other;
forming an opening in the insulating stack structure;
removing portions of the plurality of sacrificial layers exposed by the opening so as to form a plurality of recesses;
forming a plurality of first gate portions in the plurality of recesses;
forming a gate dielectric layer on a sidewall of the opening to cover the plurality of first gate portions and the plurality of insulating layers;
forming a channel layer in the opening to cover a sidewall of the gate dielectric layer;
forming a first conductive pillar and a second conductive pillar in the openings, wherein the first conductive pillar and the second conductive pillar are separated from each other and electrically connected to the channel layer respectively;
removing the plurality of sacrificial layers to form a plurality of lateral openings;
forming a ferroelectric portion in each of the plurality of lateral openings to cover another sidewall of a corresponding first gate layer, and a top surface and a bottom surface of a corresponding lateral opening; and
forming a second gate portion in each lateral opening, wherein a sidewall, a top surface, and a bottom surface of the second gate portion are covered by the ferroelectric portion.

19. The method of claim 18, wherein the second gate layer, the ferroelectric portion and the first gate portion has a first coupling area smaller than a second coupling area of the first gate portion, the gate dielectric layer and the channel layer.

20. The method of claim 19, wherein a ratio of the first coupling area to the second coupling area is between 0.2 and 0.5.

* * * * *